US012615761B2

(12) United States Patent
Jeong et al.

(10) Patent No.: US 12,615,761 B2
(45) Date of Patent: Apr. 28, 2026

(54) SEMICONDUCTOR MEMORY DEVICE

(71) Applicant: SAMSUNG ELECTRONICS CO., LTD., Suwon-si (KR)

(72) Inventors: Moonyoung Jeong, Suwon-si (KR); Hyungjun Noh, Suwon-si (KR); Sangho Lee, Suwon-si (KR); Yoongi Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 356 days.

(21) Appl. No.: 18/225,798

(22) Filed: Jul. 25, 2023

(65) Prior Publication Data

US 2024/0196593 A1     Jun. 13, 2024

(30) Foreign Application Priority Data

Dec. 9, 2022     (KR) ........................ 10-2022-0171899

(51) Int. Cl.
*H10B 12/00*          (2023.01)
(52) U.S. Cl.
CPC ........... *H10B 12/315* (2023.02); *H10B 12/05* (2023.02)
(58) Field of Classification Search
CPC ...... H10B 12/315; H10B 12/05; H10B 53/30; H10B 12/482; H10B 12/488; H10B 51/30; H10B 51/50; H10D 30/477
See application file for complete search history.

(56) References Cited

U.S. PATENT DOCUMENTS

| | | | |
|---|---|---|---|
| 8,283,229 B2 | 10/2012 | Kim et al. | |
| 10,651,182 B2 | 5/2020 | Morris et al. | |
| 11,264,512 B2 | 3/2022 | Dewey et al. | |
| 2020/0111917 A1 | 4/2020 | Ramaswamy et al. | |
| 2021/0143284 A1 | 5/2021 | Karda et al. | |
| 2021/0375935 A1 | 12/2021 | Ling et al. | |
| 2022/0352177 A1* | 11/2022 | Zhang | H10B 12/37 |
| 2023/0320077 A1 | 10/2023 | Jeong et al. | |
| 2023/0363143 A1 | 11/2023 | Lee et al. | |
| 2024/0098963 A1* | 3/2024 | Han | H10B 12/00 |
| 2024/0147690 A1* | 5/2024 | Chuang | H10B 12/05 |

FOREIGN PATENT DOCUMENTS

| | | |
|---|---|---|
| KR | 10-0486253 B1 | 5/2005 |
| KR | 10-1607265 B1 | 3/2016 |
| KR | 10-2023-0140962 A | 10/2023 |
| KR | 10-2023-0155795 A | 11/2023 |

* cited by examiner

*Primary Examiner* — Samuel Park
(74) *Attorney, Agent, or Firm* — Muir Patent Law, PLLC

(57)     ABSTRACT

A semiconductor memory device includes a bit line on a substrate and extending in a first direction parallel to a bottom surface of the substrate, a first active pattern on the bit line, a first word line intersecting the first active pattern in a second direction which is parallel to the bottom surface of the substrate and intersects the first direction, and a first conductive pattern on the first active pattern. The first word line includes a first side surface facing the first direction. The first active pattern includes a first portion between the first word line and the first conductive pattern, a second portion between the first word line and the bit line, and a third portion extending on the first side surface of the first word line to connect the first portion to the second portion of the first active pattern.

20 Claims, 37 Drawing Sheets

MP2

ACT(P2)

190

HR

190

ACT(P1)

100

B                  B'

D1

D2

D3

MP2

ACT(P2)

190

WI(WI2)

WL(WL2)

190

ACT(P1)

100

B            B'

D1

D2

D3

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2022-0171899, filed on Dec. 9, 2022, in the Korean Intellectual Property Office, the entire contents of which are hereby incorporated by reference.

BACKGROUND

1. Field

The present disclosure relates to a semiconductor device, and more particularly, to a semiconductor memory device.

2. Description of the Related Art

As design rules of semiconductor memory devices have been reduced, manufacturing techniques have been developed to improve integration densities, operating speeds and yields of semiconductor memory devices. Thus, a transistor having a vertical channel has been suggested to increase an integration density, a resistance and a current driving ability of a transistor.

SUMMARY

In an aspect, a semiconductor memory device may include a bit line disposed on a substrate and extending in a first direction parallel to a bottom surface of the substrate, a first active pattern on the bit line, a first word line intersecting the first active pattern in a second direction which is parallel to the bottom surface of the substrate and intersects the first direction, and a first conductive pattern on the first active pattern. The first word line may include a first side surface facing the first direction. The first active pattern may include a first portion between the first word line and the first conductive pattern, a second portion between the first word line and the bit line, and a third portion extending on the first side surface of the first word line to connect the first portion to the second portion.

In an aspect, a semiconductor memory device may include a bit line disposed on a substrate and extending in a first direction parallel to a bottom surface of the substrate, a first active pattern on the bit line, and a first word line intersecting the first active pattern in a second direction which is parallel to the bottom surface of the substrate and intersects the first direction. The first active pattern may include a first side surface and a second side surface, which are opposite to each other in the first direction. The first word line may include a first side surface and a second side surface, which are opposite to each other in the first direction. The second side surface of the first word line may be aligned with the second side surface of the first active pattern. The first side surface of the first word line may be located between the first side surface of the first active pattern and the second side surface of the first word line.

In an aspect, a semiconductor memory device may include a bit line disposed on a substrate and extending in a first direction parallel to a bottom surface of the substrate, an active pattern on the bit line, and a word line intersecting the active pattern in a second direction which is parallel to the bottom surface of the substrate and intersects the first direction. The active pattern may include a first side surface and a second side surface, which are opposite to each other in the first direction. The word line may be buried in the active pattern from the second side surface of the active pattern toward the first side surface of the active pattern.

BRIEF DESCRIPTION OF THE DRAWINGS

Features will become apparent to those of skill in the art by describing in detail exemplary embodiments with reference to the attached drawings, in which.

DETAILED DESCRIPTION

Embodiments will now be described more fully with reference to the accompanying drawings.

Figure 1:
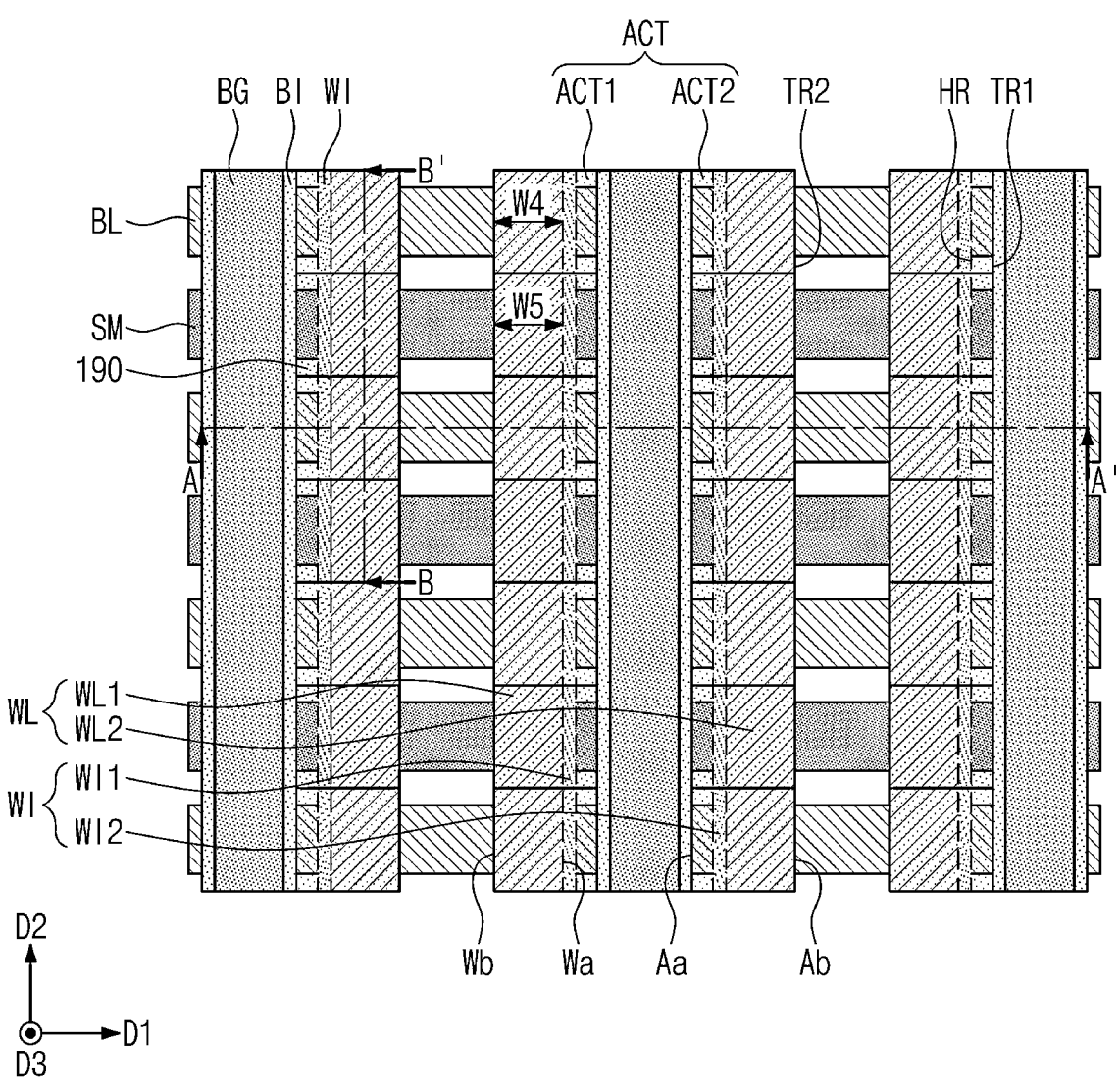
FIG. 1 is a plan view illustrating a semiconductor memory device according to some embodiments.
Figure 2A:
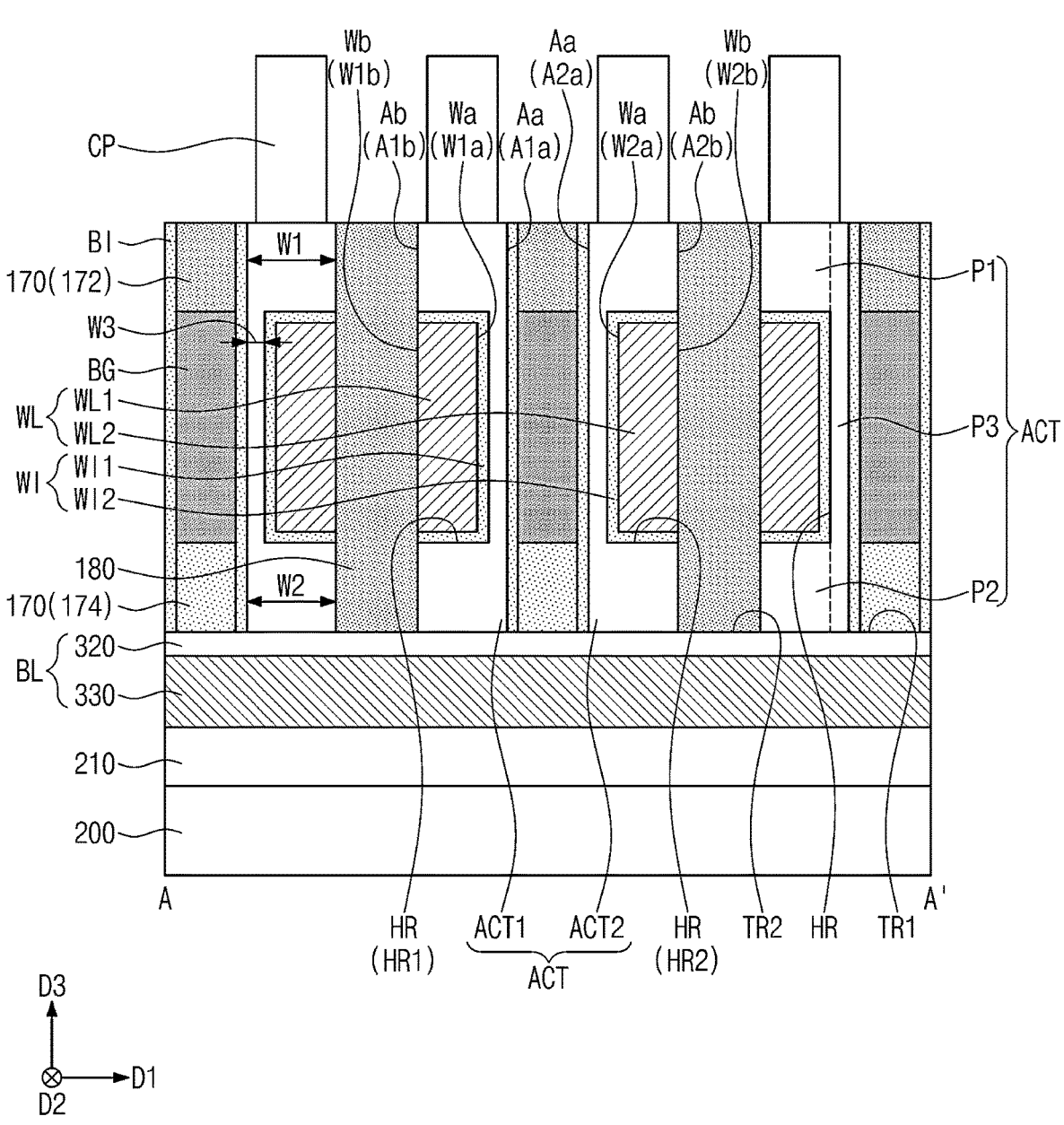
FIGS. 2A and 2B are cross-sectional views taken along lines A-A' and B-B' of FIG. 1, respectively.
Figure 2B:
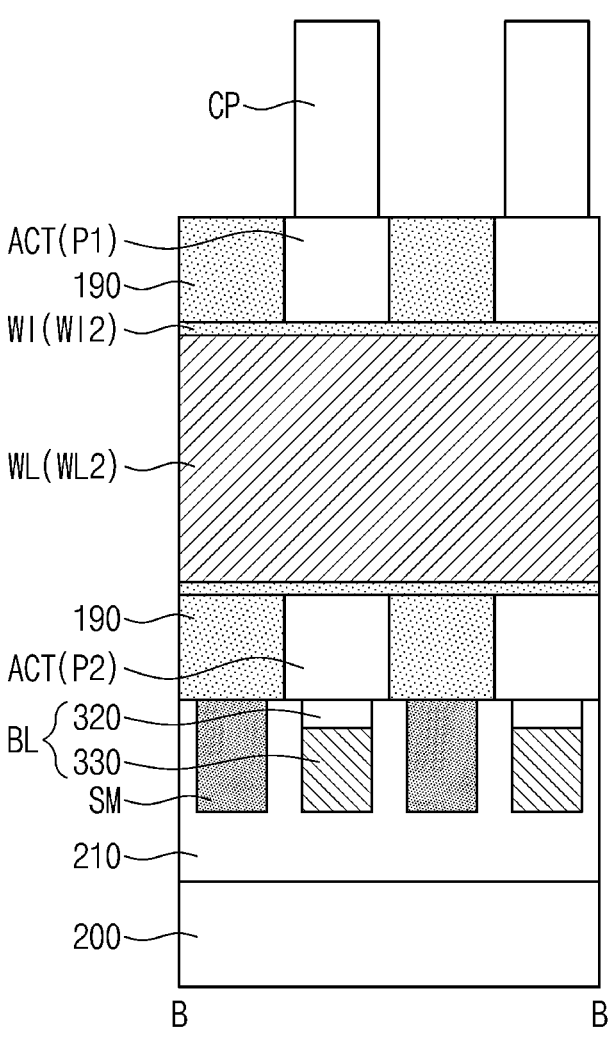

FIG. 1 is a plan view illustrating a semiconductor memory device according to some embodiments. FIGS. 2A and 2B are cross-sectional views taken along lines A-A' and B-B' of FIG. 1, respectively.

Referring to FIGS. 1, 2A and 2B, a semiconductor memory device according to embodiments may be provided. The semiconductor memory device according to the embodiments may include memory cells including vertical channel transistors (VCTs).

The semiconductor memory device may include a substrate 200. The substrate 200 may extend in parallel to a first direction D1 and a second direction D2, which intersect each other. For example, a bottom surface of the substrate 200 may be parallel to the first direction D1 and the second direction D2. The substrate 200 may include at least one of a semiconductor material (e.g., silicon), an insulating material (e.g., silicon oxide), and a semiconductor or conductor covered with an insulating material. In the present specification, the term 'A or B', 'at least one of A and B', 'at least one of A or B', 'A, B or C', 'at least one of A, B and C', or 'at least one of A, B or C' may include any and all combinations of one or more of the associated listed items.

A bit line BL may be provided on the substrate 200. The bit line BL may extend, e.g., lengthwise, in the first direction D1. The bit line BL may be provided in plurality, and the plurality of bit lines BL may be spaced apart from each other in the second direction D2. In some embodiments, each of the bit lines BL may include a metal-containing pattern 330 and a poly-silicon pattern 320 on the metal-containing pattern 330. The metal-containing pattern 330 may include at least one of a conductive metal nitride (e.g., TiN, TaN, WN, NbN, TiAlN, TiSiN, TaSiN, or RuTiN), a metal (e.g., Al, Cu, Ti, Ta, Ru, W, Mo, Pt, Ni, or Co), and a conductive metal oxide (e.g., PtO, $RuO_2$, $IrO_2$, $SrRuO_3$ (SRO), (Ba,Sr)

RuO$_3$ (BSRO), CaRuO$_3$ (CRO), or LSCo). The poly-silicon pattern 320 may include dopant-doped poly-silicon. Each of the bit lines BL may further include an ohmic pattern between the metal-containing pattern 330 and the poly-silicon pattern 320. The ohmic pattern may include a metal silicide. In certain embodiments, each of the bit lines BL may include a two-dimensional or three-dimensional material. For example, each of the bit lines BL may include at least one of graphene corresponding to a carbon-based two-dimensional material and carbon nanotube corresponding to a carbon-based three-dimensional material.

A shielding structure SM may be provided between the bit lines BL adjacent to each other. The shielding structure SM may extend, e.g., lengthwise, in the first direction D1. For example, the shielding structure SM may be provided in plurality, and each of the plurality of shielding structures SM may be provided between the bit lines BL adjacent to each other. The plurality of shielding structures SM may be spaced apart from each other in the second direction D2. In certain embodiments, the shielding structure SM may include protruding portions provided between the bit lines BL adjacent to each other, and a connecting portion connecting the protruding portions to each other under the bit lines BL. For example, the shielding structure SM may include a conductive material, e.g., a metal. In another example, the shielding structure SM may include a conductive material including an air gap or a void therein. In yet another example, the shielding structure SM may be an air gap.

An interlayer insulating layer 210 may be provided on the substrate 200. The interlayer insulating layer 210 may cover a bottom surface of the bit line BL and a bottom surface of the shielding structure SM. The interlayer insulating layer 210 may be disposed between the bit line BL and the substrate 200, and between the shielding structure SM and the substrate 200. For example, the interlayer insulating layer 210 may include at least one of silicon oxide, silicon nitride, silicon oxynitride, and a low-k dielectric material. In some embodiments, the interlayer insulating layer 210 may be a single layer. In certain embodiments, the interlayer insulating layer 210 may be a multi-layer including two or more material layers. In some embodiments, an adhesive layer may be disposed between the interlayer insulating layer 210 and the substrate 200 for adhesion between the interlayer insulating layer 210 and the substrate 200.

An active pattern ACT may be provided on the bit line BL. The active pattern ACT may be provided in plurality, and the plurality of active patterns ACT may be spaced apart from each other in the first direction D1 and the second direction D2. For example, the plurality of active patterns ACT may be spaced apart from each other in the first direction D1 by first and second isolation patterns 170 and 180 to be described later. For example, the plurality of active patterns ACT may be spaced apart from each other in the second direction D2 by a third isolation pattern 190 to be described later. For example, the active pattern ACT may have a symbol '[' or ']'-shape when viewed in a cross-sectional view, e.g., a cross-section along the first direction D1 of the active pattern ACT may have the shape of '[' or ']' (FIG. 2A).

As illustrated in FIGS. 2A and 2B, the active pattern ACT may include a first portion P1, a second portion P2, and a third portion P3. The first portion P1 of the active pattern ACT may be a portion of the active pattern ACT, which is disposed between a word line WL to be described later and a conductive pattern CP to be described later. The second portion P2 of the active pattern ACT may be another portion of the active pattern ACT, which is disposed between the word line WL and the bit line BL. The third portion P3 of the active pattern ACT may be still another portion of the active pattern ACT, which extends on a side surface of the word line WL (i.e., a first side surface Wa, to be described later, of the word line WL) to connect the first portion P1 to the second portion P2. The third portion P3 of the active pattern ACT may extend in a third direction D3 perpendicular to the bottom surface of the substrate 200 from a bottom of the first portion P1 to a top of the second portion P2. For example, the third portion P3 may be connected to the first portion P1 and the second portion P2 without interfaces therebetween, e.g., the first to third portions P1 to P3 may be connected to each other integrally and seamlessly. In another example, the third portion P3 may be connected to at least one of the first portion P1 and the second portion P2 with an interface interposed therebetween, and they may be distinguished from each other.

The first portion P1, the second portion P2, and the third portion P3 of the active pattern ACT may include the same material or different materials. For example, the first portion P1 and the second portion P2 may include at least one of single-crystalline silicon and poly-silicon. For example, the third portion P3 may include at least one of single-crystalline silicon, poly-silicon, an oxide semiconductor material (e.g., InxGayZnzO, InxGaySizO, InxSnyZnzO, InxZnyO, ZnxO, ZnxSnyO, ZnxOyN, ZrxZnySnzO, SnxO, HfxInyZnzO, GaxZnySnzO, AlxZnySnzO, YbxGayZnzO, and/or InxGayO), and a two-dimensional material (e.g., graphene, and/or a transition metal dichalcogenide (TMD) including a transition metal element (e.g., Mo, W, V, Nb, Ta, and/or Ti) and a chalcogen element (e.g., S, Se, and/or Te)).

In some embodiments, one side surface of the first portion P1 and one side surface of the second portion P2 may be aligned with one side surface of the third portion P3 along the third direction D3. On the other hand, another side surface of the first portion P1 and another side surface of the second portion P2 may protrude from another side surface of the third portion P3 in the first direction D1 or an opposite direction to the first direction D1. For example, the first side surfaces of the first to third portions P1 to P3 facing away from the word line WL may be aligned (e.g., coplanar) with each other along the third direction D3, while the second side surfaces (i.e., opposite the first side surfaces) of the first and second portion P1 and P2 may extend horizontally (i.e., in the first direction D1) beyond the second side surface (i.e., opposite the first side surface) of the third portion P3.

Figure 3:
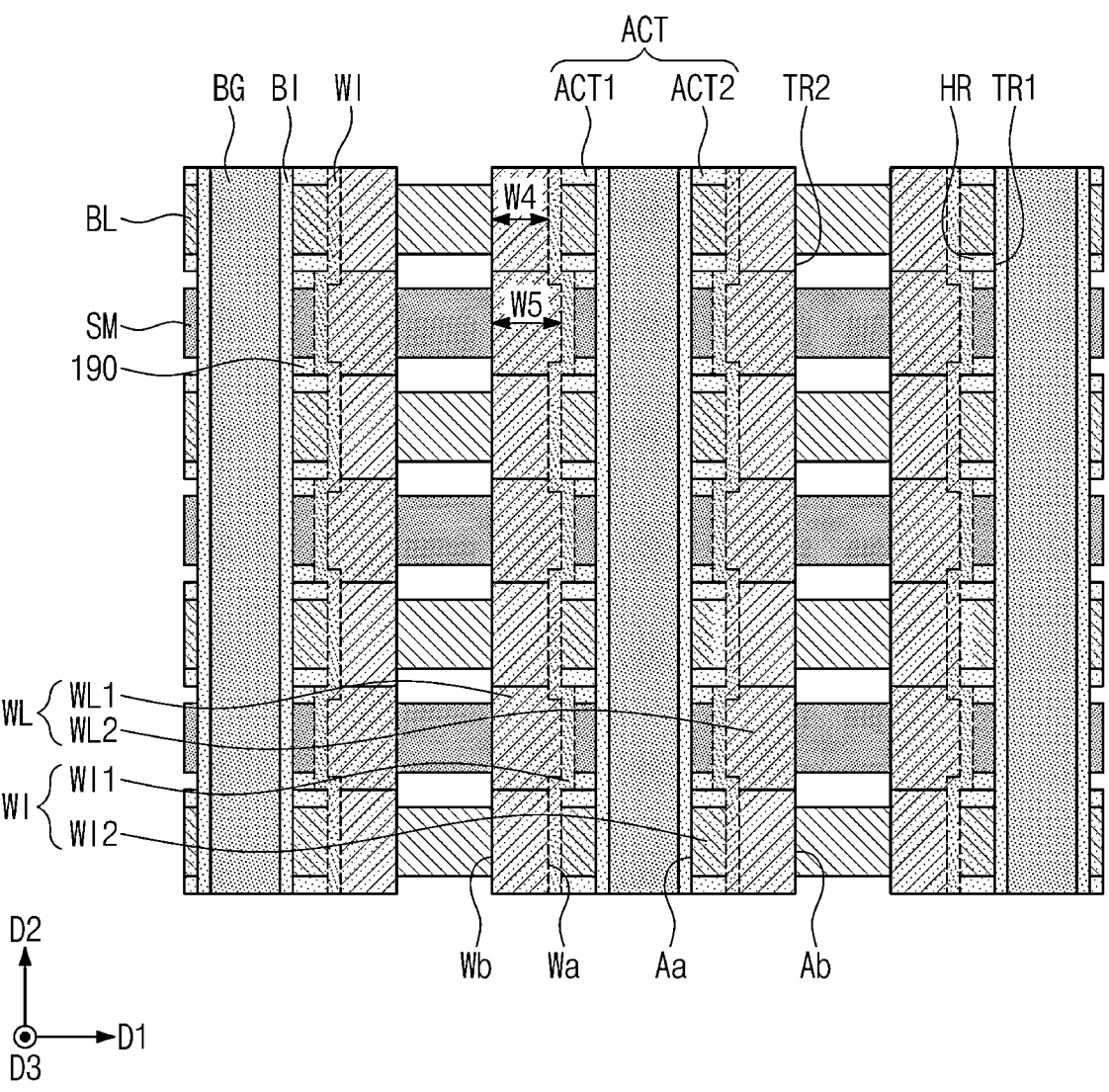
FIG. 3 is a plan view illustrating a semiconductor memory device according to some embodiments.

Thus, the active pattern ACT may include a horizontal recess region HR. The horizontal recess region HR may be defined by a bottom surface of the first portion P1, a top surface of the second portion P2, and the other side surface of the third portion P3. In other words, referring to FIG. 2A, the horizontal recess region HR may be defined by the second side surface of the of the third portion P3 and the respective top and bottom portions of the first and second portions P1 and P2 that extend beyond the second side surface of the third portion P3. For example, as illustrated in FIG. 3, the first portion P1, the third portion P3, and the second portion P may be linear portions connected sequentially and perpendicularly to each other.

The active pattern ACT may include a first side surface Aa and a second side surface Ab, which are opposite to each other in the first direction D1. The first side surface Aa of the active pattern ACT may include a first side surface of the active pattern ACT (i.e., a side surface that faces away from the word line WL and has the aligned first side surfaces of the first portion P1, the second portion P2, and the third portion P3). The second side surface Ab of the active pattern ACT may be a second side surface of the active pattern ACT (i.e., a side surface that includes the second side surfaces of the first portion P1 and the second portion P2). The horizontal recess region HR may be a region recessed from the second side surface Ab of the active pattern ACT toward the first side surface Aa of the active pattern ACT.

The active pattern ACT may have a first width W1, a second width W2, and a third width W3 in the first direction D1. The first width W1 of the active pattern ACT may be a width at a higher level than a top surface of the word line WL to be described later (e.g., the first width W1 may be a width in the first direction D1 of the first portion P1). The second width W2 of the active pattern ACT may be a width at a lower level than a bottom surface of the word line WL (e.g., the second width W2 may be a width in the first direction D1 of the second portion P2). The third width W3 of the active pattern ACT may be a width at a level between the top surface and the bottom surface of the word line WL (e.g., the third width W3 may be a width in the first direction D1 of the third portion P3). For example, the third width W3 may be less than each of the first width W1 and the second width W2.

The active pattern ACT may include a pair of active patterns ACT1 and ACT2. The pair of active patterns ACT1 and ACT2 may include a first active pattern ACT1 and a second active pattern ACT2, which are spaced apart from each other in the first direction D1. A first side surface A1a of the first active pattern ACT1 and a first side surface A2a of the second active pattern ACT2 may be disposed adjacent to each other. A second side surface A1b of the first active pattern ACT1 and a second side surface A2b of the second active pattern ACT2 may be spaced apart from each other with the first side surfaces A1a and A1b interposed therebetween, e.g., the third portions P3 of the first and second active patterns ACT1 and ACT2 may face each other. A first trench region TR1 may be provided between the pair of active patterns ACT1 and ACT2, e.g., the first trench region TR1 may be provided between the third portions P3 of the first and second active patterns ACT1 and ACT2. The first trench region TR1 may extend, e.g., lengthwise, in the second direction D2.

The first active pattern ACT1 may include a first horizontal recess region HR1, and the second active pattern ACT2 may include a second horizontal recess region HR2. The first horizontal recess region HR1 may be a region recessed from the second side surface A1b of the first active pattern ACT1 toward the second active pattern ACT2. The second horizontal recess region HR2 may be a region recessed from the second side surface A2b of the second active pattern ACT2 toward the first active pattern ACT1.

The active pattern ACT may include dopants having a conductivity type. Thus, the active pattern ACT may include first and second source/drain regions including dopants, and a channel region between the first and second source/drain regions. The first source/drain region may be a region of the active pattern ACT, which is adjacent to the conductive pattern CP to be described later. The second source/drain region may be another region of the active pattern ACT, which is adjacent to the bit line BL. The channel region may be still another region of the active pattern ACT, which is adjacent to the word line WL to be described later.

In some embodiments, the first source/drain region may include at least a portion of the first portion P1 of the active pattern ACT, and the second source/drain region may include at least a portion of the second portion P2 of the active pattern ACT. According to embodiments, the second portion P2 may be provided to increase a contact area between the second source/drain region and the bit line BL. Thus, a contact resistance between the second source/drain region and the bit line BL may be reduced, and a process margin for contacting them may be improved. Likewise, the first portion P1 may be provided to increase a contact area between the first source/drain region and the conductive pattern CP to be described later. Thus, a contact resistance between the first source/drain region and the conductive pattern CP may be reduced, and a process margin may be improved. As a result, electrical characteristics and productivity of the semiconductor memory device may be improved.

The word line WL may be disposed in the active pattern ACT. For example, the word line WL may be disposed in the horizontal recess region HR of the active pattern ACT. For example, the word line WL may be buried in the active pattern ACT from the second side surface Ab of the active pattern ACT toward the first side surface Aa of the active pattern ACT. In operation of the semiconductor memory device, the channel region of the active pattern ACT may be controlled by the word line WL.

The word line WL may be provided in plurality. The plurality of word lines WL may be spaced apart from each other in the first direction D1 and may extend, e.g., lengthwise, in the second direction D2. The word line WL may intersect the active pattern ACT and the third isolation pattern 190 to be described later in the second direction D2.

The word line WL may include a first side surface Wa and a second side surface Wb, which are opposite to each other in the first direction D1. The second side surface Wb of the word line WL may be aligned (e.g., coplanar) with the second side surface Ab of the active pattern ACT along the third direction D3. The second side surface Wb of the word line WL may be exposed by the first portion P1 and the second portion P2 of the active pattern ACT and may be in contact with the second isolation pattern 180 to be described later. The first side surface Wa of the word line WL may be spaced apart from the first side surface Aa of the active pattern ACT in the first direction D1. The first side surface Wa of the word line WL may be located between the first side surface Aa of the active pattern ACT and the second side surface Wb of the word line WL, e.g., the first side surface Wa of the word line WL may face the second side surface of the third portion P3 of the active pattern ACT.

In some embodiments, the word line WL may include a pair of word lines WL1 and WL2. The pair of word lines WL1 and WL2 may include a first word line WL1 and a second word line WL2, which are spaced apart from each other in the first direction D1. The first word line WL1 may intersect the first active pattern ACT1 in the second direction D2 and may be disposed in the first horizontal recess region HR1. The second word line WL2 may intersect the second active pattern ACT2 in the second direction D2 and may be disposed in the second horizontal recess region HR2. The pair of word lines WL1 and WL2 may be spaced apart from each other with the third portions P3 of the first and second active patterns ACT1 and ACT2 interposed therebetween.

The word line WL may include at least one of a conductive metal nitride (e.g., TIN, TaN, WN, NbN, TiAIN, TiSiN, TaSiN, or RuTiN), a metal (e.g., Al, Cu, Ti, Ta, Ru, W, Mo, Pt, Ni, or Co), and a conductive metal oxide (e.g., PtO, $RuO_2$, $IrO_2$, $SrRuO_3$ (SRO), $(Ba,Sr)RuO_3$ (BSRO), $CaRuO_3$ (CRO), or LSCo). For example, the word line WL may be a single layer. In another example, the word line WL may be a multi-layer including two or more different material layers. The material layers of the multi-layer may have different work functions.

According to embodiments, the word line WL may be buried in the active pattern ACT, and thus a length of the channel region of the active pattern ACT may be increased. As a result, the electrical characteristics of the semiconductor memory device may be improved.

A word line insulating pattern W1 may be disposed between the active pattern ACT and the word line WL. For example, the word line insulating pattern W1 may be disposed between the first portion P1 of the active pattern ACT and the word line WL, between the second portion P2 of the active pattern ACT and the word line WL, and may extend between the third portion P3 of the active pattern ACT and the word line WL. The word line insulating pattern W1 may, e.g., completely, separate the active pattern ACT and the word line WL from each other.

The word line insulating pattern W1 may conformally cover an, e.g., entire, inner surface of the horizontal recess region HR. The word line insulating pattern W1 may cover the first side surface Wa of the word line WL. In some embodiments, the word line insulating pattern W1 may further cover a top surface and/or a bottom surface of the word line WL. In some embodiments, the word line insulating pattern W1 may not cover the second side surface Wb of the word line WL. For example, the word line insulating pattern W1 may have a symbol '[' or ']'-shape when viewed in a cross-sectional view. For example, the word line insulating pattern W1 may include at least one of silicon oxide, a high-k dielectric material, a low-k dielectric material, and a ferroelectric material.

The word line insulating pattern W1 may include a pair of word line insulating patterns W11 and W12. The pair of word line insulating patterns W11 and W12 may include a first word line insulating pattern W11 and a second word line insulating pattern W12. The first word line insulating pattern W11 may be disposed between the first active pattern ACT1 and the first word line WL1. The first word line insulating pattern W11 may conformally cover an inner surface of the first horizontal recess region HR1. The second word line insulating pattern W12 may be disposed between the second active pattern ACT2 and the second word line WL2. The second word line insulating pattern W12 may conformally cover an inner surface of the second horizontal recess region HR2.

A back gate electrode BG may be disposed between the pair of active patterns ACT1 and ACT2. The back gate electrode BG may be provided in the first trench region TR1. The back gate electrode BG may be disposed between the first side surface A1a of the first active pattern ACT1 and the first side surface A2a of the second active pattern ACT2. The third portion P3 of the first active pattern ACT1 may be disposed between the back gate electrode BG and the first word line WL1. The third portion P3 of the second active pattern ACT2 may be disposed between the back gate electrode BG and the second word line WL2.

The back gate electrode BG may include at least one of a conductive metal nitride (e.g., TiN, TaN, WN, NbN, TiAlN, TiSiN, TaSiN, or RuTiN), a metal (e.g., Al, Cu, Ti, Ta, Ru, W, Mo, Pt, Ni, or Co), and a conductive metal oxide (e.g., PtO, $RuO_2$, $IrO_2$, $SrRuO_3$ (SRO), $(Ba,Sr)RuO_3$ (BSRO), $CaRuO_3$ (CRO), or LSCo). For example, the back gate electrode BG may be a single layer. In another example, the back gate electrode BG may be a multi-layer including two or more different material layers. The material layers of the multi-layer may have different work functions.

The back gate electrode BG may control the channel region of the active pattern ACT along with the word line WL. For example, a single back gate electrode BG may control the channel region of the first active pattern ACT1 along with the first word line WL1 and may control the channel region of the second active pattern ACT2 along with the second word line WL2.

The first isolation pattern 170 may cover a top surface and a bottom surface of the back gate electrode BG. The first isolation pattern 170 may be provided in the first trench region TR1. The first isolation pattern 170 may include a first sub-isolation pattern 172 covering the top surface of the back gate electrode BG, and a second sub-isolation pattern 174 covering the bottom surface of the back gate electrode BG. The first isolation pattern 170 may be disposed between the pair of active patterns ACT1 and ACT2. For example, the first isolation pattern 170 may be disposed between the first side surface A1a of the first active pattern ACT1 and the first side surface A2a of the second active pattern ACT2. The first isolation pattern 170 may extend, e.g., lengthwise, in the second direction D2 in parallel to the back gate electrode BG. For example, the first isolation pattern 170 may include at least one of silicon oxide, silicon oxynitride, and silicon nitride.

A back gate insulating pattern BI may be disposed between the back gate electrode BG and the first side surface Aa of the active pattern ACT. For example, the back gate insulating pattern BI may be disposed between the back gate electrode BG and the first side surface A1a of the first active pattern ACT1 and between the back gate electrode BG and the first side surface A2a of the second active pattern ACT2. The back gate insulating pattern BI may separate the back gate electrode BG from the active pattern ACT. For example, the back gate insulating pattern BI may extend between the first isolation pattern 170 and the active pattern ACT.

The back gate insulating pattern BI and the word line insulating pattern W1 may include the same material or different materials. For example, each of the back gate insulating pattern BI and the word line insulating pattern W1 may include at least one of silicon oxide, a high-k dielectric material, a low-k dielectric material, and a ferroelectric material.

The second isolation pattern 180 may be provided between a first pair of active patterns ACT1 and ACT2 and a second pair of active patterns ACT1 and ACT2. A second trench region TR2 may be provided between the first pair of active patterns ACT1 and ACT2 and the second pair of active patterns ACT1 and ACT2, and the second isolation pattern 180 may be provided in the second trench region TR2.

The first pair of active patterns ACT1 and ACT2 may be spaced apart from the second pair of active patterns ACT1 and ACT2 in the first direction D1. For example, the second isolation pattern 180 may be disposed between the first active pattern ACT1 of the first pair of active patterns ACT1 and ACT2 and the second active pattern ACT2 of the second pair of active patterns ACT1 and ACT2. More particularly, the second isolation pattern 180 may be disposed between the second side surface A1b of the first active pattern ACT1 of the first pair of active patterns ACT1 and ACT2 and the second side surface A2b of the second active pattern ACT2 of the second pair of active patterns ACT1 and ACT2. For example, the second isolation pattern 180 may include at least one of silicon oxide, silicon oxynitride, and silicon nitride.

The third isolation pattern 190 may be provided between the active patterns ACT adjacent to each other in the second direction D2. The adjacent active patterns ACT may be spaced apart from each other by the third isolation pattern 190. For example, the word line WL may intersect the adjacent active patterns ACT and the third isolation pattern 190 in the second direction D2. The word line insulating pattern W1 may also be disposed between the word line WL and the third isolation pattern 190. For example, the third isolation pattern 190 may include at least one of silicon oxide, silicon oxynitride, and silicon nitride.

The conductive pattern CP may be provided on the active pattern ACT. The conductive pattern CP may be provided in plurality. Each of the plurality of conductive patterns CP may be connected to a corresponding active pattern ACT. The conductive pattern CP may include a conductive material. For example, the conductive material may include at least one of a conductive metal nitride (e.g., TiN, TaN, WN, NbN, TiAIN, TiSiN, TaSiN, or RuTiN), a metal (e.g., Al, Cu, Ti, Ta, Ru, W, Mo, Pt, Ni, or Co), and a conductive metal oxide (e.g., PtO, $RuO_2$, $IrO_2$, $SrRuO_3$ (SRO), $(Ba,Sr)RuO_3$ (BSRO), $CaRuO_3$ (CRO), or LSCo). A shape and characteristics of the conductive pattern CP may be variously changed.

FIG. 3 is a plan view illustrating a semiconductor memory device according to some embodiments.

For example, referring to FIG. 3, the word line WL may extend, e.g., lengthwise, in the second direction D2. Here, a width of the word line WL in the first direction D1 may change as a position in the word line WL moves in the second direction D2. For example, in an overlapping region of the word line WL and the active pattern ACT (in a top view), a width of the word line WL in the first direction D1 may be defined as a fourth width W4. In an overlapping region of the word line WL and the third isolation pattern 190 (in a top view), a width of the word line WL in the first direction D1 may be defined as a fifth width W5. Here, the fourth width W4 and the fifth width W5 may be equal to each other or different from each other.

In another example, as shown in FIG. 1, the width of the word line WL in the first direction D1 may be substantially uniform even though the position moves in the second direction D2. For example, each of the first side surface Wa and the second side surface Wb of the word line WL may extend in a straight line in the second direction D2. Thus, the fourth width W4 and the fifth width W5 may be substantially equal to each other.

For example, as shown in FIG. 3, the width of the word line WL in the first direction D1 may be changed as the position moves in the second direction D2. For example, the second side surface Wb of the word line WL may extend in a straight line in the second direction D2. The first side surface Wa of the word line WL may extend in the second direction D2 and may have an uneven shape with respect to the first direction D1. Thus, the fourth width W4 may be different from the fifth width W5 (e.g., the fourth width W4 may be less than the fifth width W5).

Figure 4:
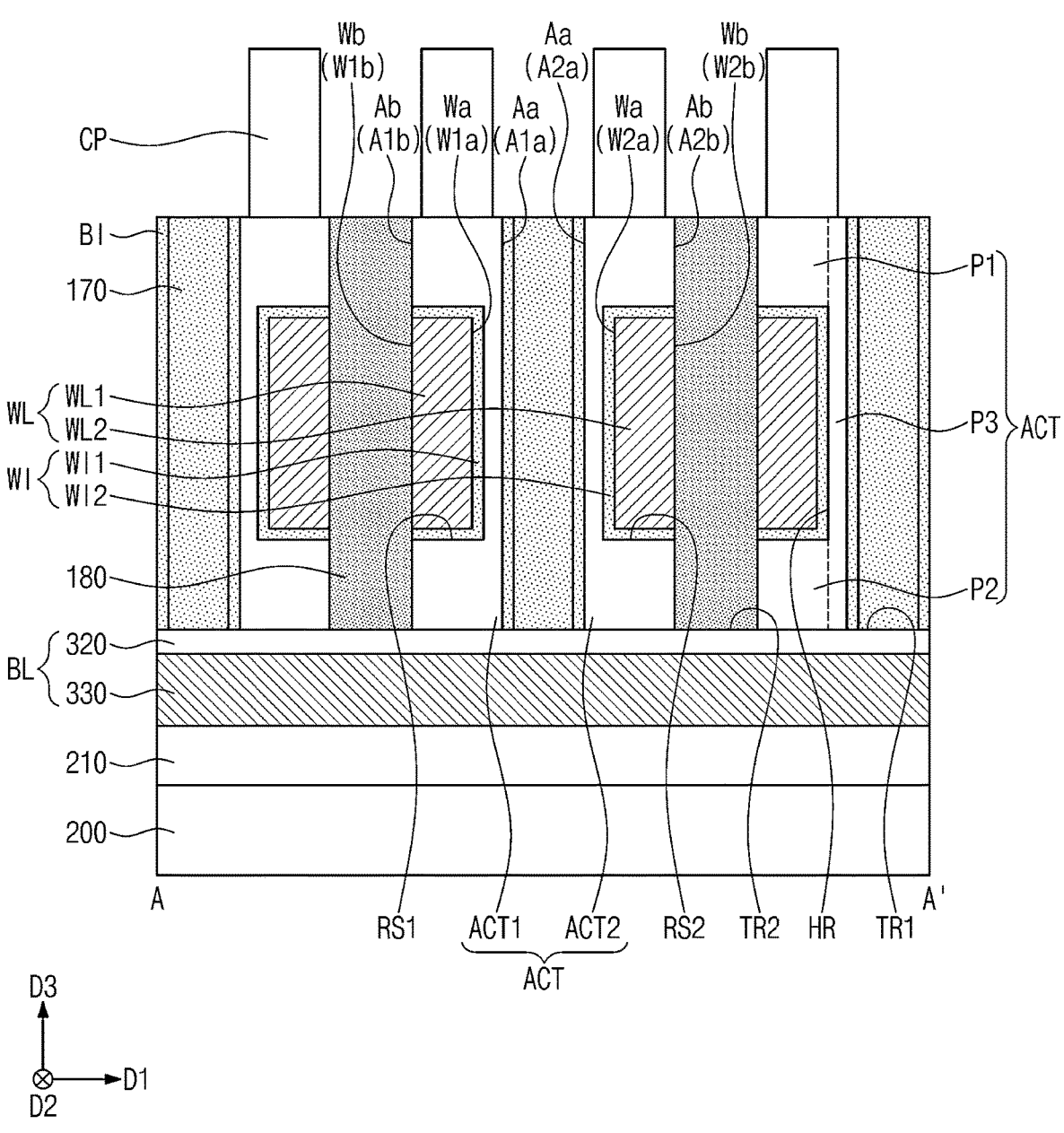
FIG. 4 is a cross-sectional view taken along line A-A' of FIG. 1 to illustrate a semiconductor memory device according to some embodiments.

FIG. 4 is a cross-sectional view taken along the line A-A' of FIG. 1 to illustrate a semiconductor memory device according to some embodiments.

Referring to FIG. 4, the back gate electrode BG of FIG. 2A may not be provided in the first trench region TR1. A first isolation pattern 170 may be disposed in the first trench region TR1. The first isolation pattern 170 may continuously extend in the third direction D3 in the, e.g., entire, first trench region TR1. The first trench region TR1 may be provided in plurality. For example, the back gate electrode BG may be provided or not provided in each of the plurality of first trench regions TR1. In certain embodiments, the back gate electrode BG may be provided in each of some of the first trench regions TR1, and the back gate electrode BG may not be provided in each of others of the first trench regions TR1. Since the back gate electrode BG is not provided, the word line WL may alone control the channel region of a corresponding active pattern ACT.

Figure 5A:
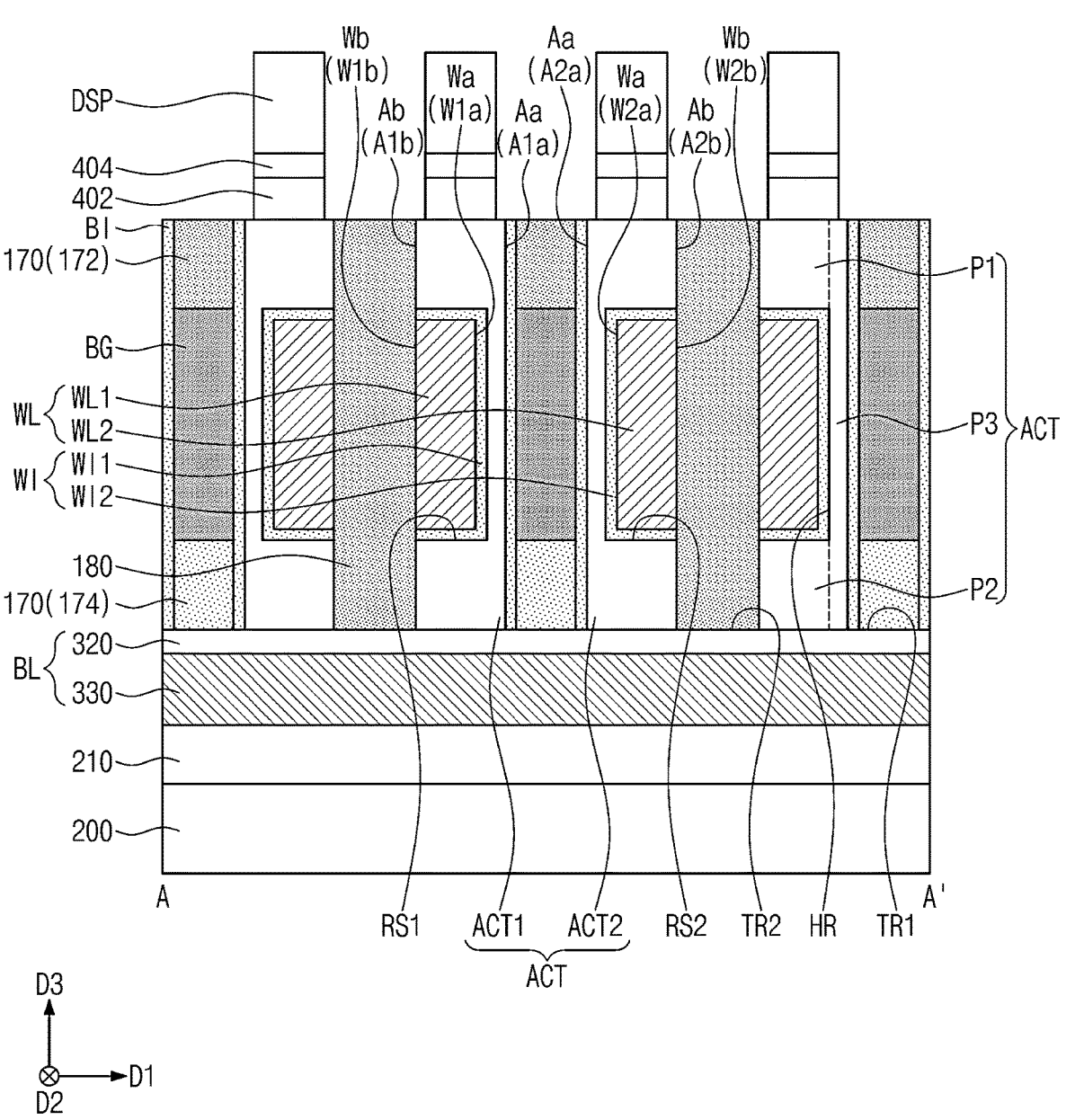
FIGS. 5A and 5B are cross-sectional views taken along line A-A' of FIG. 1 to illustrate semiconductor memory devices according to some embodiments.
Figure 5B:
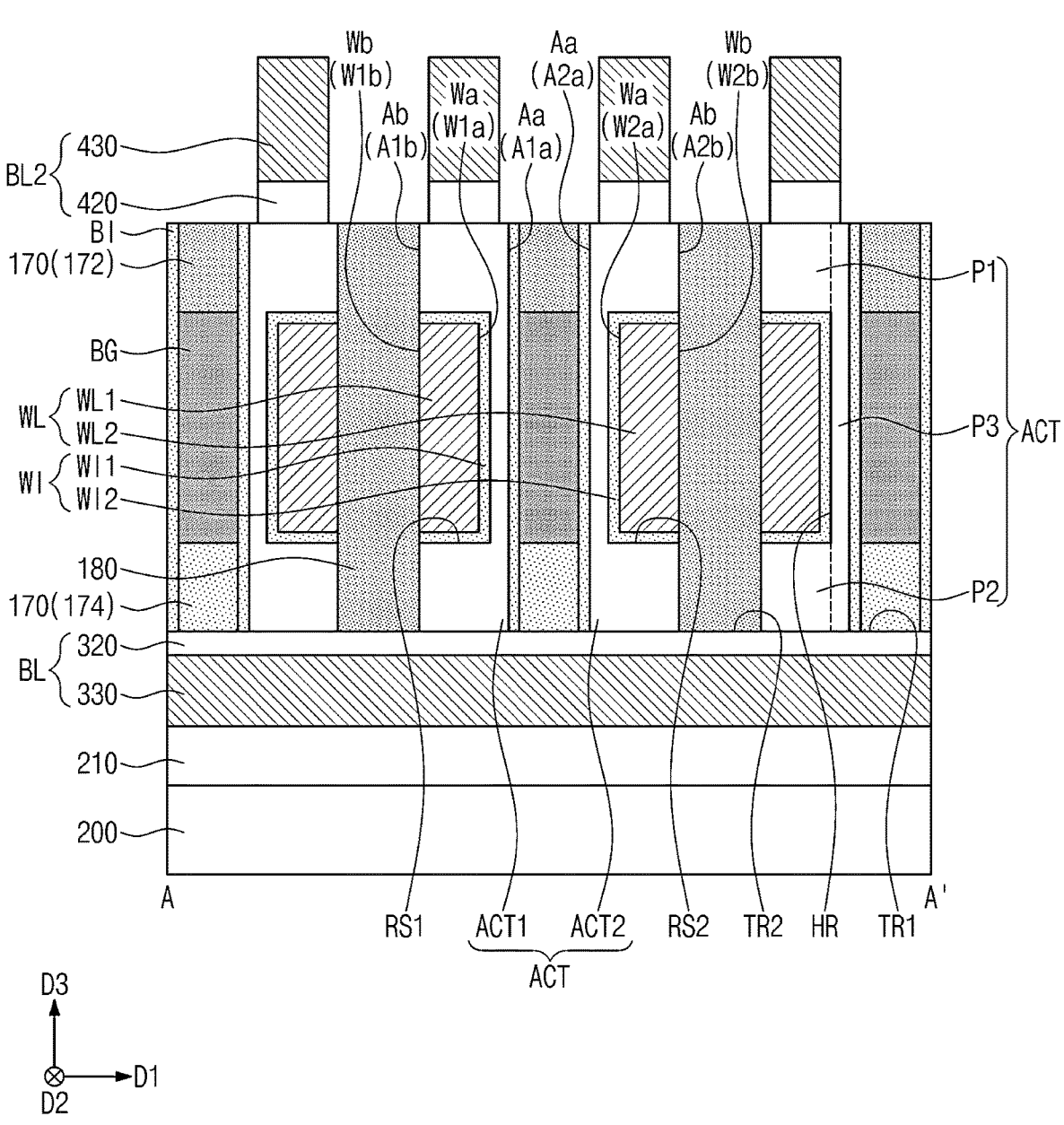

FIGS. 5A and 5B are cross-sectional views taken along the line A-A' of FIG. 1 to illustrate semiconductor memory devices according to some embodiments.

Referring to FIGS. 5A and 5B, the shape and characteristics of the conductive pattern CP of FIG. 2A may be variously changed.

In some embodiments, as shown in FIG. 5A, the conductive pattern CP may include conductive contacts 402 and 404. The conductive contacts 402 and 404 may be electrically connected to the first portion P1 of the active pattern ACT. The conductive contacts 402 and 404 may be provided in plurality, and the plurality of conductive contacts 402 and 404 may be provided on the active patterns ACT, respectively. For example, the conductive contacts 402 and 404 may include a first conductive contact 402 on the active pattern ACT, and a second conductive contact 404 on the first conductive contact 402. The first conductive contact 402 and the second conductive contact 404 may each independently include at least one of a conductive metal nitride (e.g., TiN, TaN, WN, NON, TiAIN, TiSiN, TaSiN, or RuTiN), a metal (e.g., Al, Cu, Ti, Ta, Ru, W, Mo, Pt, Ni, or Co), and a conductive metal oxide (e.g., PtO, $RuO_2$, $IrO_2$, $SrRuO_3$ (SRO), $(Ba,Sr)RuO_3$ (BSRO), $CaRuO_3$ (CRO), or LSCo).

A data storage pattern DSP may be provided on the conductive contacts 402 and 404. For some examples, the data storage pattern DSP may be a capacitor including a lower electrode, a dielectric layer and an upper electrode. In this case, the semiconductor memory device according to embodiments may be a dynamic random access memory (DRAM) device. For certain examples, the data storage pattern DSP may include a magnetic tunnel junction pattern. In this case, the semiconductor memory device according to embodiments may be a magnetic random access memory (MRAM) device. For certain examples, the data storage pattern DSP may include a phase-change material or a variable resistance material. In this case, the semiconductor memory device according to embodiments may be a phase-change random access memory (PRAM) device or a resistive random access memory (ReRAM) device. For example, the data storage pattern DSP may include at least one of other various structures and/or materials capable of storing data.

In certain embodiments, as shown in FIG. 5B, the conductive pattern CP may include a second bit line BL2. Here, the bit line BL may be referred to as a first bit line and may be distinguished from the second bit line BL2. The second bit line BL2 may extend, e.g., lengthwise, in the second direction D2. The second bit line BL2 may be provided in plurality, and the plurality of second bit lines BL2 may be spaced apart from each other in the first direction D1. Each of the second bit lines BL2 may be connected to the active patterns ACT arranged in a line in the second direction D2. Material features of the second bit line BL2 may be similar to or different from those of the first bit line BL. In some embodiments, the second bit line BL2 may include a poly-silicon pattern 420 on the active pattern ACT, and a metal-containing pattern 430 on the poly-silicon pattern 420. In certain embodiments, the second bit line BL2 may include a two-dimensional or three-dimensional material.

In the case in which the conductive pattern CP includes the second bit line BL2, the word line insulating pattern WI may include, e.g., a ferroelectric material. A polarization direction of the ferroelectric material may be changed by a voltage applied to the word line WL. Thus, the channel region of the active pattern ACT may be controlled. As a result, even though the data storage pattern DSP described with reference to FIG. 5A is not provided, the semiconductor memory device may perform operations of storing, reading and writing data.

FIGS. 6 to 23B are views illustrating stages in a method of manufacturing a semiconductor memory device according to some embodiments. More particularly, FIGS. 6, 8, 10, 12, 14, 16, 18, 20 and 22 are plan views illustrating stages in a manufacturing method according to some embodiments. FIGS. 7A, 9, 11, 13A, 17A, 19A, 21A and 23A are cross-sectional views corresponding to lines A-A' of FIGS. 6, 8, 10, 12, 16, 18, 20 and 22, respectively. FIGS. 7B, 13B, 15, 17B, 19B, 21B and 23B are cross-sectional views corresponding to lines B-B' of FIGS. 6, 12, 14, 16, 18, 20 and 22, respectively.

Figure 2B:
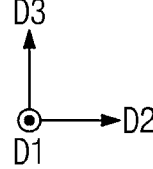

Hereinafter, an exemplary method of manufacturing a semiconductor memory device according to some embodiments will be described with reference to FIGS. 6 to 23B. In the descriptions of FIGS. 6 to 23B, the terms 'top surface' and 'bottom surface' may respectively mean 'the bottom surface' and 'the top surface' in the view of the completely manufactured semiconductor memory device described with reference to FIGS. 1 to 2B. Likewise, in the descriptions of FIGS. 6 to 23B, spatially relative terms 'upper', 'lower', 'on' and 'under' may respectively mean 'lower', 'upper', 'under' and 'on' in the view of the completely manufactured semiconductor memory device described with reference to FIGS. 1 to 2B. Hereinafter, the descriptions to the same features as mentioned above will be omitted for the purpose of ease and convenience in explanation.

Figure 6:
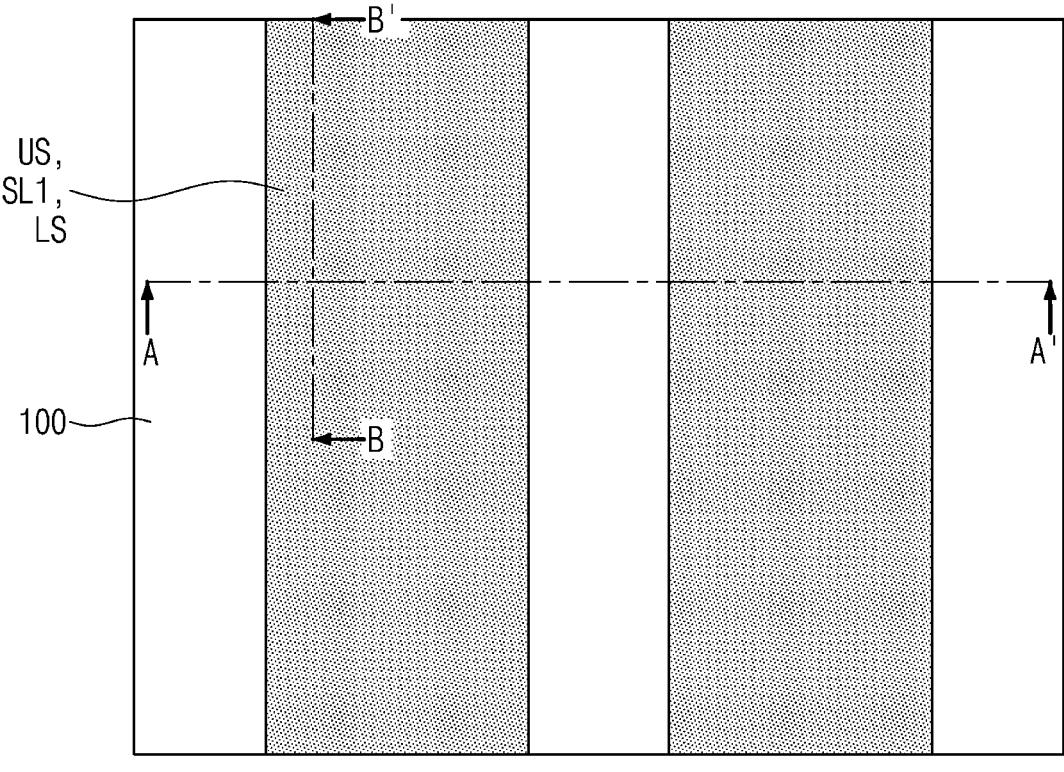
FIGS. 6 to 23B are views illustrating stages in a method of manufacturing a semiconductor memory device according to some embodiments.
Figure 7A:
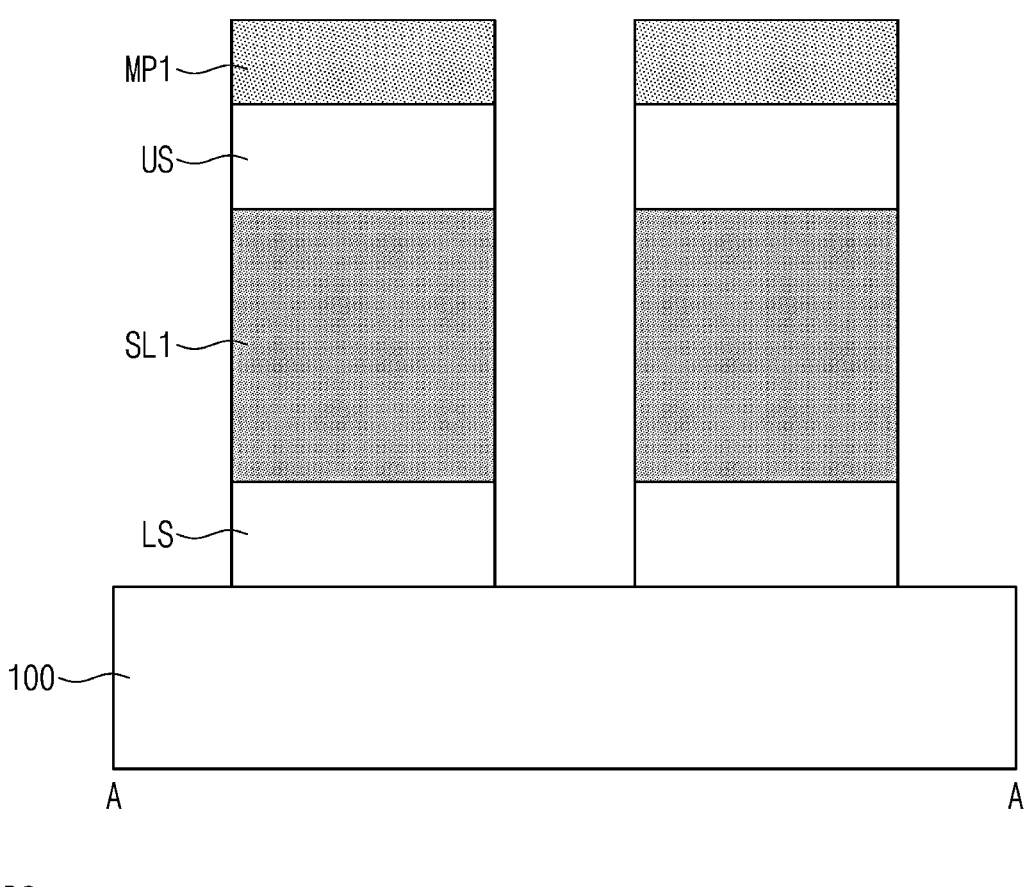
Figure 7B:
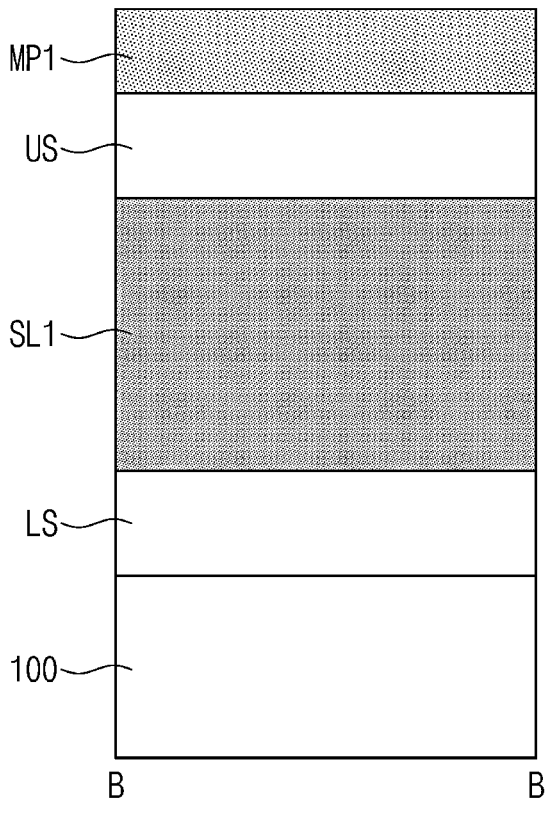

Referring to FIGS. 6 to 7B, a base substrate 100 may be provided. The base substrate 100 may extend in parallel to the first direction D1 and the second direction D2. The base substrate 100 may include at least one of a semiconductor material (e.g., silicon), an insulating material (e.g., silicon oxide), and a semiconductor or conductor covered with an insulating material.

A lower semiconductor pattern LS, a first sacrificial pattern SL1, an upper semiconductor pattern US, and a first mask pattern MP1 may be formed on the base substrate 100. The lower semiconductor pattern LS, the first sacrificial pattern SL1, the upper semiconductor pattern US, and the first mask pattern MP1 may be sequentially stacked on the base substrate 100. The lower semiconductor pattern LS, the first sacrificial pattern SL1, the upper semiconductor pattern US, and the first mask pattern MP1 may extend, e.g., lengthwise, in the second direction D2. Each of the lower semiconductor pattern LS, the first sacrificial pattern SL1, the upper semiconductor pattern US, and the first mask pattern MP1 may be provided in plurality.

The formation of the lower semiconductor pattern LS, the first sacrificial pattern SL1, the upper semiconductor pattern US, and the first mask pattern MP1 may include sequentially forming a lower semiconductor layer, a sacrificial layer, an upper semiconductor layer, and the first mask pattern MP1 on the base substrate 100, and etching the lower semiconductor layer, the sacrificial layer and the upper semiconductor layer by using the first mask pattern MP1 as an etch mask. After the etching process, a remaining portion of the lower semiconductor layer, a remaining portion of the sacrificial layer and a remaining portion of the upper semiconductor layer may correspond to the lower semiconductor pattern LS, the first sacrificial pattern SL1, and the upper semiconductor pattern US, respectively. A side surface of the lower semiconductor pattern LS, a side surface of the first sacrificial pattern SL1, and a side surface of the upper semiconductor pattern US may be exposed to the outside by the etching process.

The first sacrificial pattern SL1 may include a material having a high etch selectivity with respect to the lower and upper semiconductor patterns LS and US. For example, the lower and upper semiconductor patterns LS and US may include silicon (Si). In this case, the first sacrificial pattern SL1 may include silicon-germanium (SiGe) having an etch selectivity with respect to the silicon. For example, the first sacrificial pattern SL1 may be a single layer formed of a single material. In another example, the first sacrificial pattern SL1 may be a multi-layer formed of two or more materials (e.g., silicon and silicon-germanium).

Figure 8:
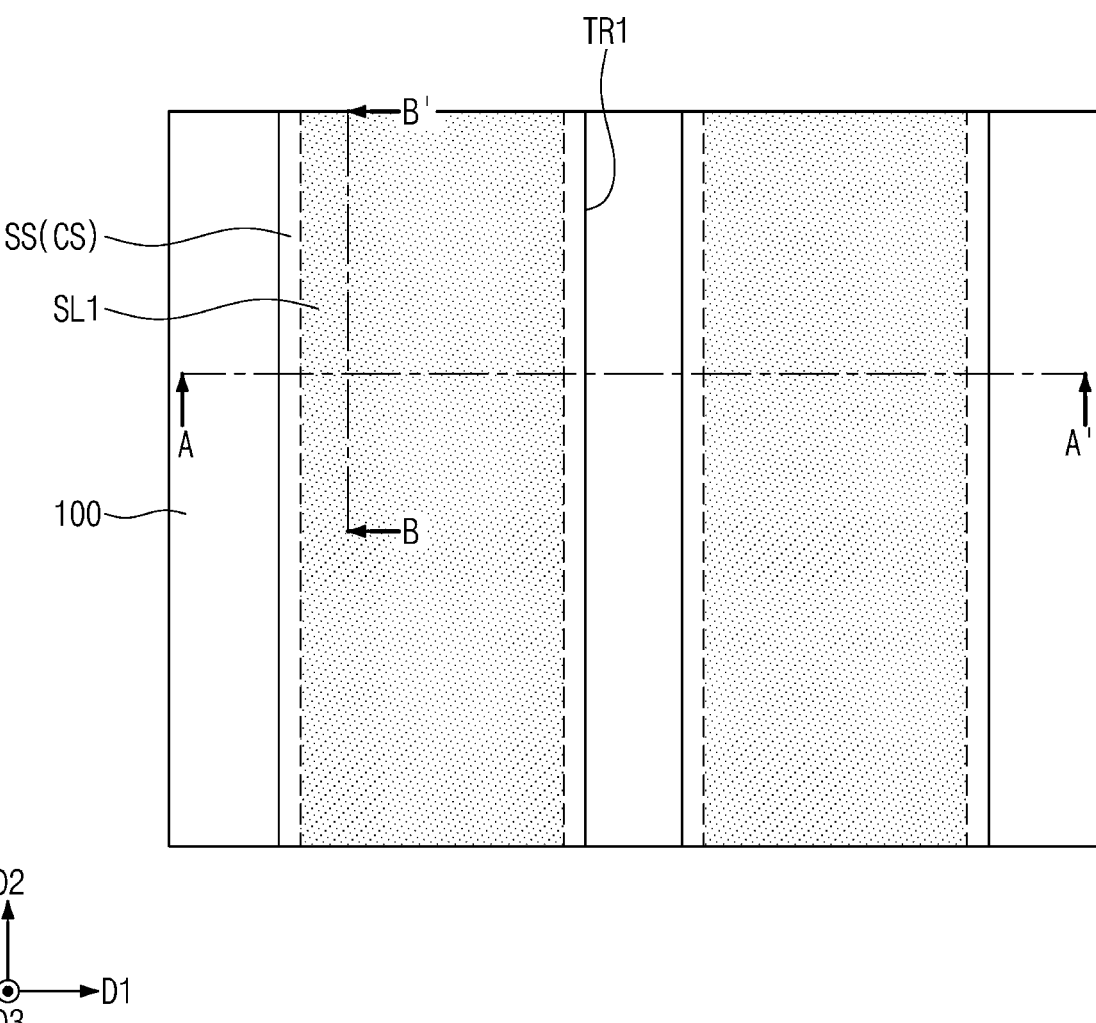
Figure 9:
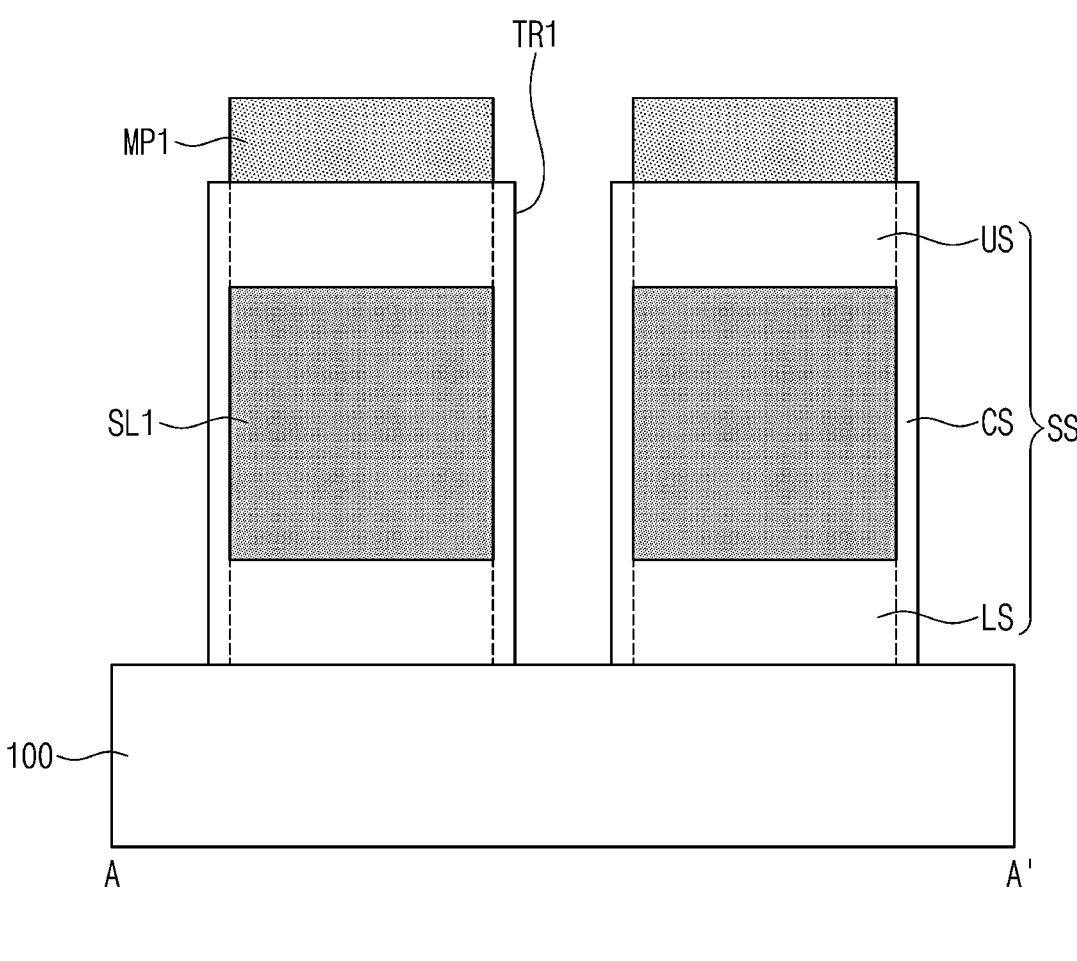
Figure 9:
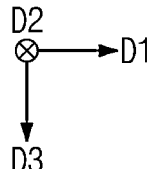

Referring to FIGS. 8 and 9, a connection semiconductor pattern CS may be formed on the base substrate 100. The connection semiconductor pattern CS may cover the side surface of the lower semiconductor pattern LS, the side surface of the first sacrificial pattern SL1, and the side surface of the upper semiconductor pattern US. The connection semiconductor pattern CS may extend in the third direction D3 on the side surface of the first sacrificial pattern SL1 to connect the lower semiconductor pattern LS and the upper semiconductor pattern US to each other. In some embodiments, the connection semiconductor pattern CS may be connected to the lower semiconductor pattern LS and the upper semiconductor pattern US without interfaces therebetween. In certain embodiments, the connection semiconductor pattern CS may be connected to at least one of the lower semiconductor pattern LS and the upper semiconductor pattern US with an interface interposed therebetween, and they may be distinguished from each other. The connection semiconductor pattern CS may also extend in the second direction D2. For example, the connection semiconductor pattern CS may not cover a side surface of the first mask pattern MP1.

For example, the formation of the connection semiconductor pattern CS may include performing a selective epitaxial growth (SEG) process using the side surface of the lower semiconductor pattern LS, the side surface of the first sacrificial pattern SL1, and the side surface of the upper semiconductor pattern US as seeds. For example, the SEG process may include a chemical vapor deposition (CVD) process or a molecular beam epitaxy (MBE) process.

For example, the connection semiconductor pattern CS may include at least one of single-crystalline silicon, polysilicon, an oxide semiconductor material (e.g., InxGayZnzO, InxGaySizO, InxSnyZnzO, InxZnyO, ZnxO, ZnxSnyO, ZnxOyN, ZrxZnySnzO, SnxO, HfxInyZnzO, GaxZnySnzO, AlxZnySnzO, YbxGayZnzO, or InxGayO), and a two-dimensional material (e.g., graphene, or a transition metal dichalcogenide (TMD) including a transition metal element (e.g., Mo, W, V, Nb, Ta, or Ti) and a chalcogen element (e.g., S, Se, or Te)).

The connection semiconductor pattern CS, the lower semiconductor pattern LS, and the upper semiconductor pattern US may constitute a semiconductor structure SS. The semiconductor structure SS may extend in the second direction D2. The semiconductor structure SS may be provided in plurality, and the plurality of semiconductor structures SS may be spaced apart from each other in the first direction D1. The first trench region TR1 may be defined by the semiconductor structures SS adjacent to each other in the first direction D1. The first trench region TR1 may extend in the second direction D2.

Figure 10:
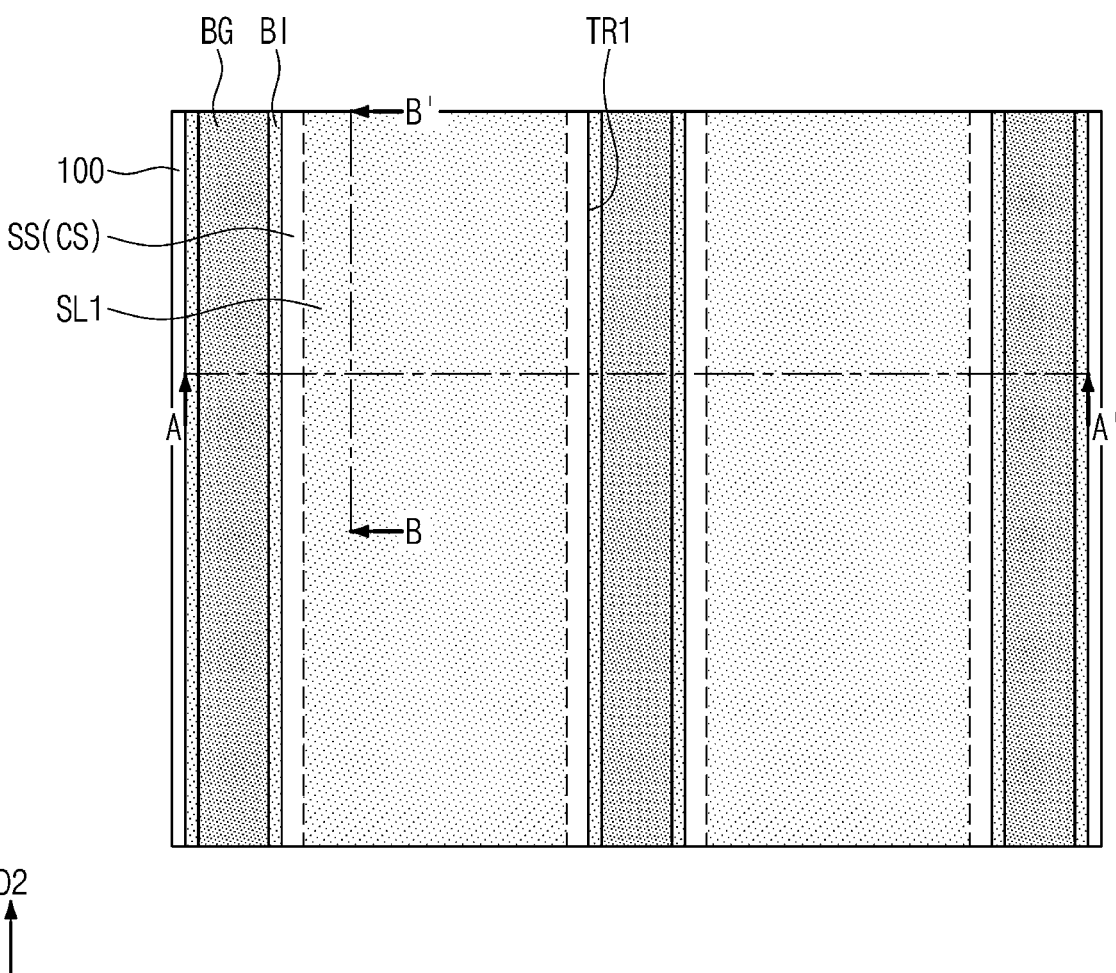
Figure 11:
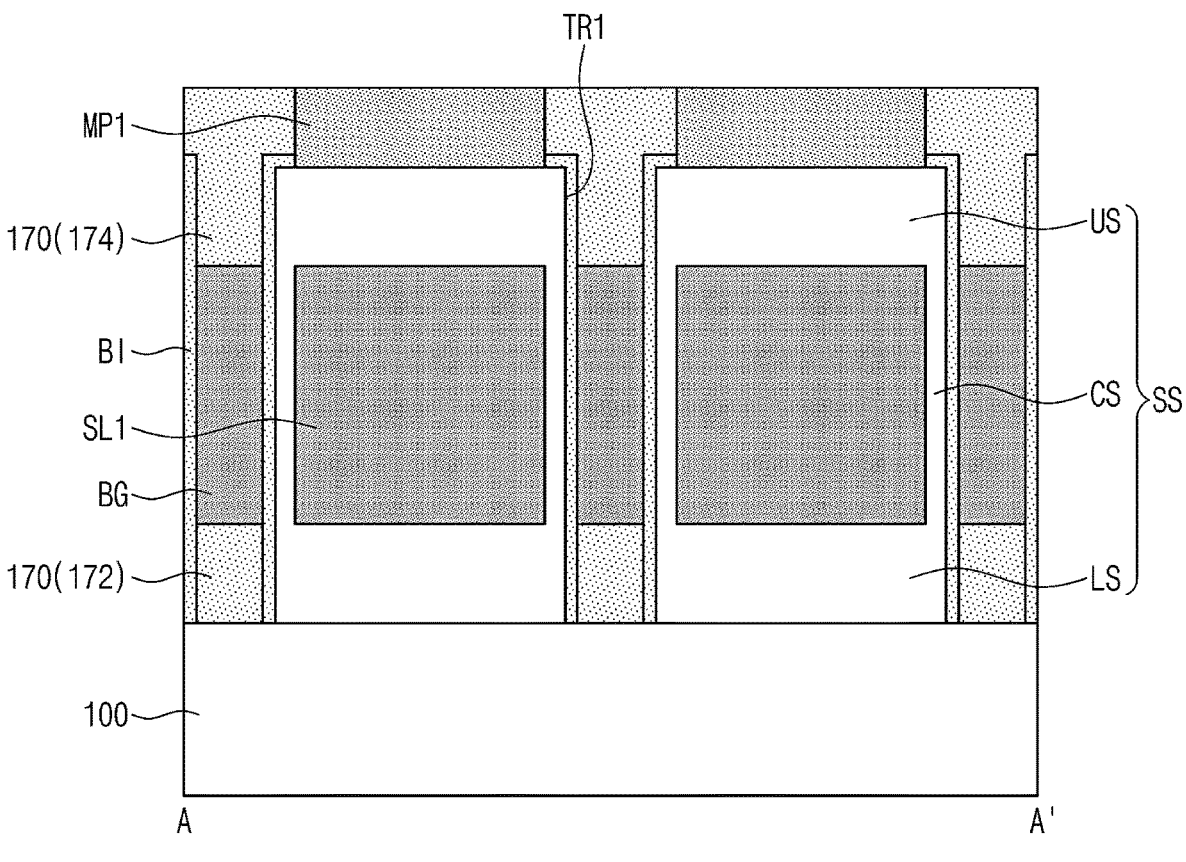
Figure 11:
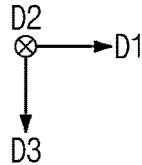

Referring to FIGS. 10 and 11, the back gate insulating pattern BI may be formed on an inner side surface of the first trench region TR1. The back gate insulating pattern BI may conformally cover the inner side surface of the first trench region TR1. The back gate insulating pattern BI may extend onto a top surface of the semiconductor structure SS.

For example, as illustrated in FIG. 11, the back gate electrode BG and the first isolation pattern 170 may be formed in the first trench region TR1. For example, the formation of the back gate electrode BG and the first isolation pattern 170 may include forming the first sub-isolation pattern 172 filling a lower portion of the first trench region TR1, forming the back gate electrode BG on the first sub-isolation pattern 172, and forming the second sub-isolation pattern 174 covering the back gate electrode BG and filling a remaining portion of the first trench region TR1. The second sub-isolation pattern 174 may cover the top surface of the semiconductor structure SS and the side surface of the first mask pattern MP1.

In another example, the back gate electrode BG may not be formed in the first trench region TR1. In this case, the first isolation pattern 170 may fill the whole of the first trench region TR1. The first isolation pattern 170 may not be divided into the first sub-isolation pattern 172 and the second sub-isolation pattern 174. In the case in which the back gate electrode BG is not formed, the semiconductor memory device of FIG. 4 may be finally manufactured.

Figure 12:
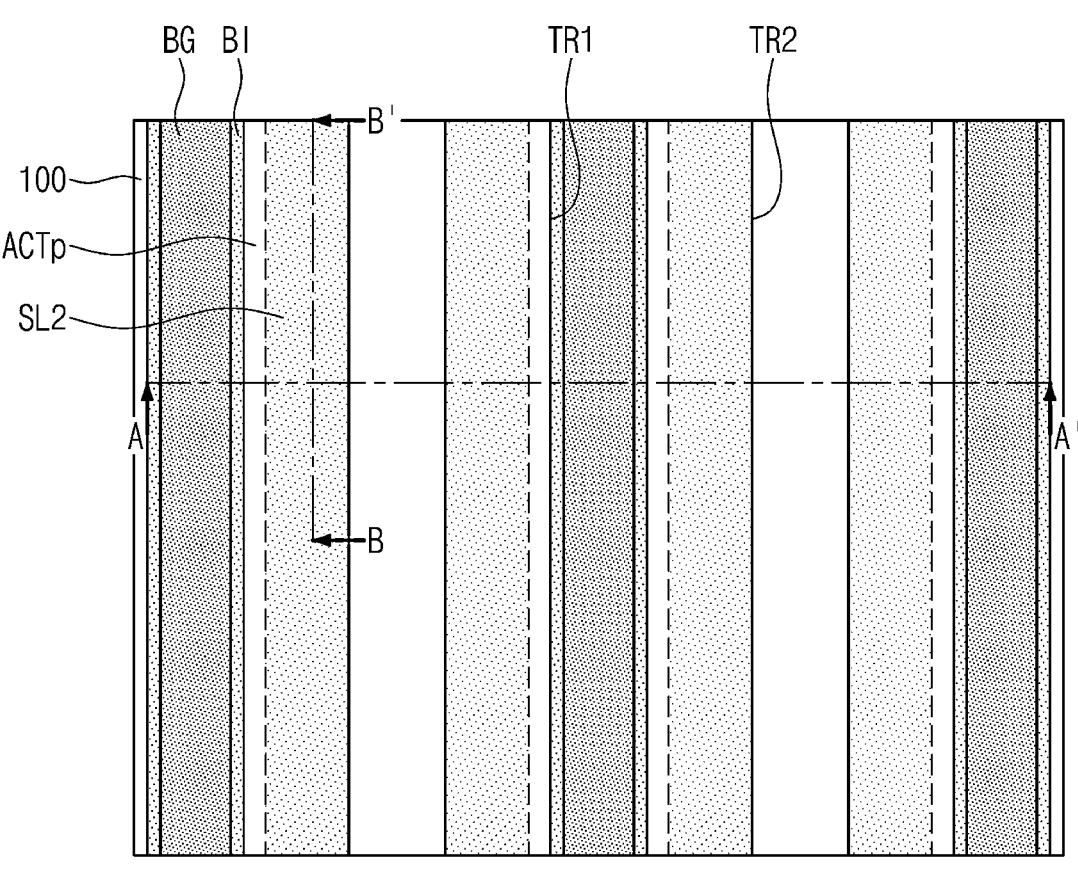
Figure 12:
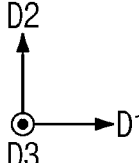
Figure 13A:
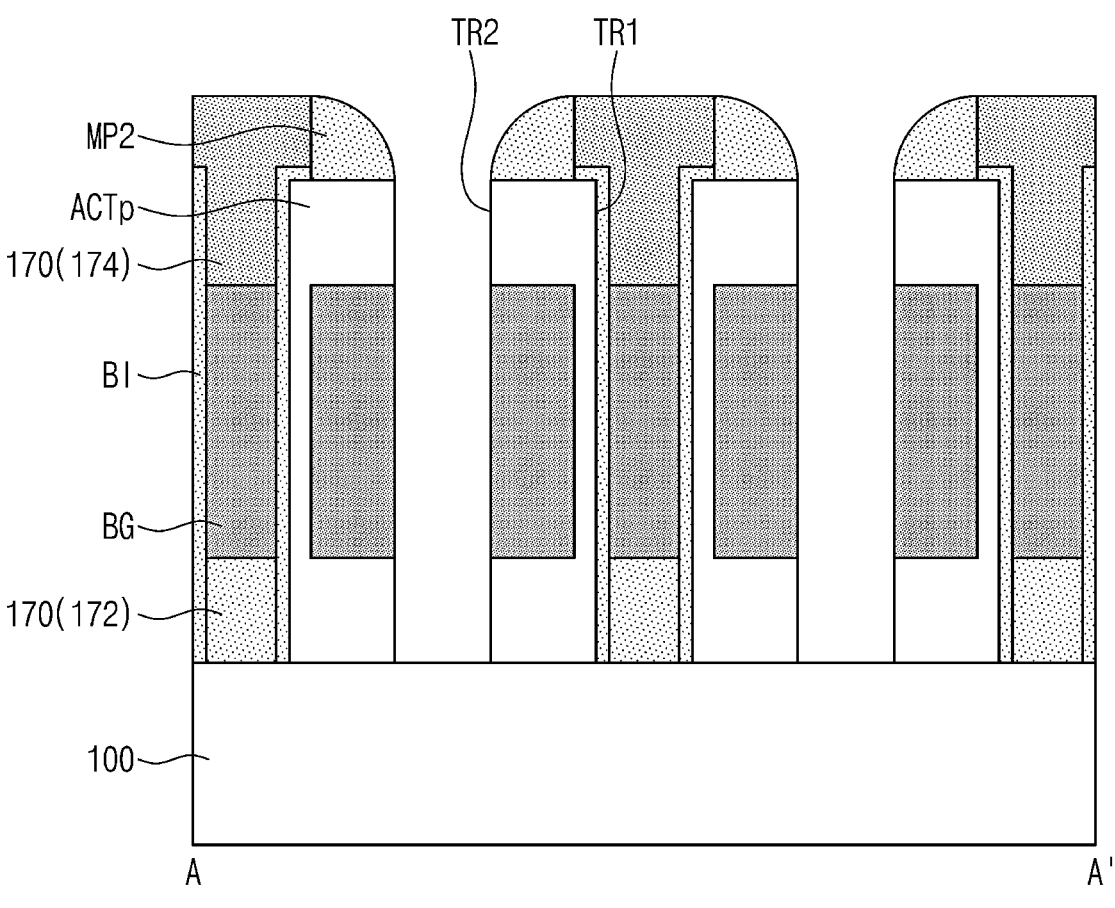
Figure 13A:
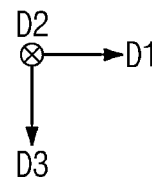
Figure 13B:
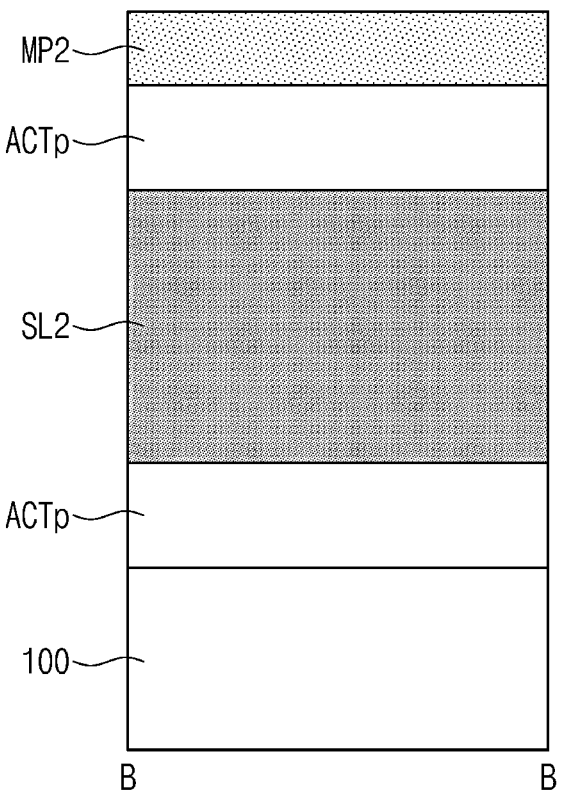

Referring to FIGS. 12 to 13B, the first mask pattern MP1 may be removed. Thus, a side surface of the first isolation pattern 170 (i.e., a side surface of the second sub-isolation pattern 174) may be exposed on the top surface of the semiconductor structure SS.

A second mask pattern MP2 may be formed on the semiconductor structure SS. The second mask pattern MP2 may cover the exposed side surface of the first isolation pattern 170 on the top surface of the semiconductor structure SS. Between the first isolation patterns 170 adjacent to each other in the first direction D1, a portion of the top surface of the semiconductor structure SS may not be covered by the second mask pattern MP2, e.g., a portion of an upper surface of the upper semiconductor pattern US may be exposed by the second mask pattern MP2.

An etching process may be performed using the first isolation pattern 170 and the second mask pattern MP2 as etch masks. A portion of the semiconductor structure SS and a portion of the first sacrificial pattern SL1 may be removed by the etching process. For example, each of the semiconductor structures SS may be divided into two preliminary active patterns ACTp by the etching process. For example, each of the first sacrificial patterns SL1 may be divided into two second sacrificial patterns SL2 by the etching process. The second sacrificial pattern SL2 may be buried from a side surface of the preliminary active pattern ACTp toward the inside of the preliminary active pattern ACTp in the first direction D1.

By the etching process, a second trench region TR2 may be formed in a region from which the portions of the semiconductor structure SS and the first sacrificial pattern SL1 are removed. The second trench region TR2 may expose one side surface of the preliminary active pattern ACTp and one side surface of the second sacrificial pattern SL2. The exposed one side surface of the preliminary active pattern ACTp and the exposed one side surface of the second sacrificial pattern SL2 may be aligned with each other along the third direction D3. The second trench region TR2 may extend in the second direction D2.

Figure 14:
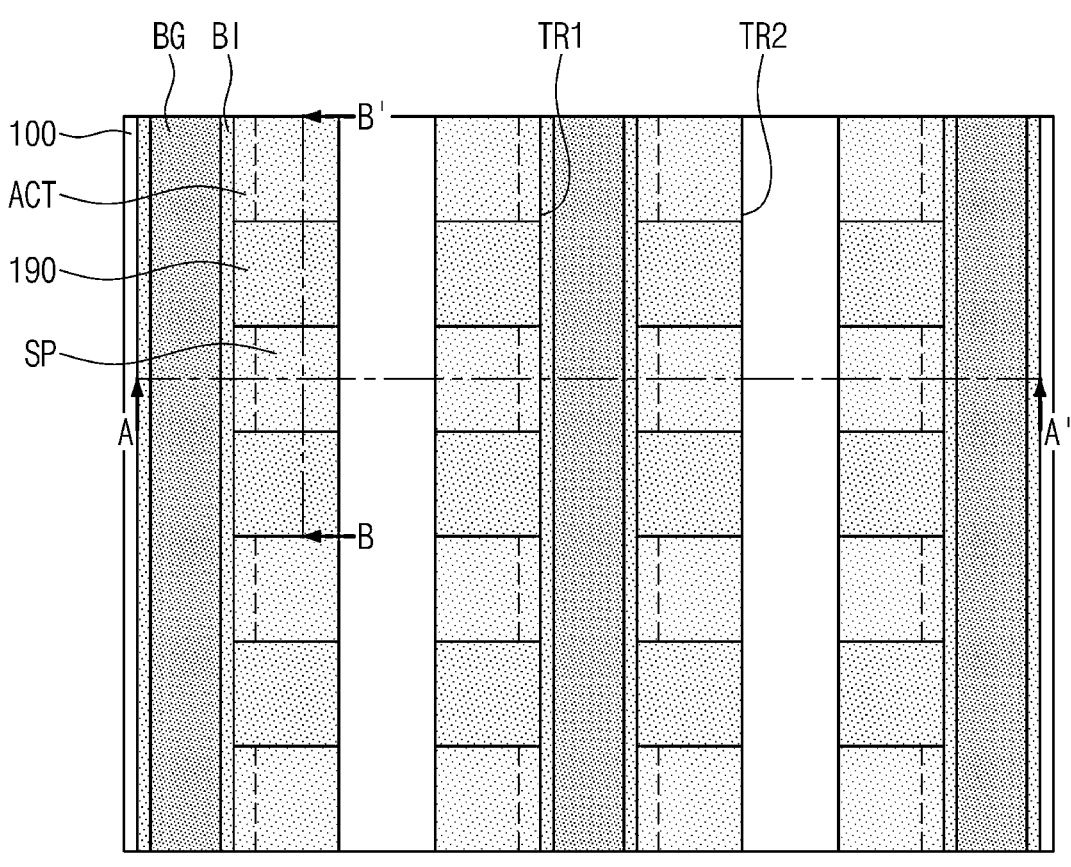
Figure 14:
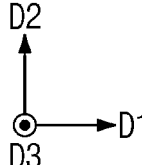
Figure 15:
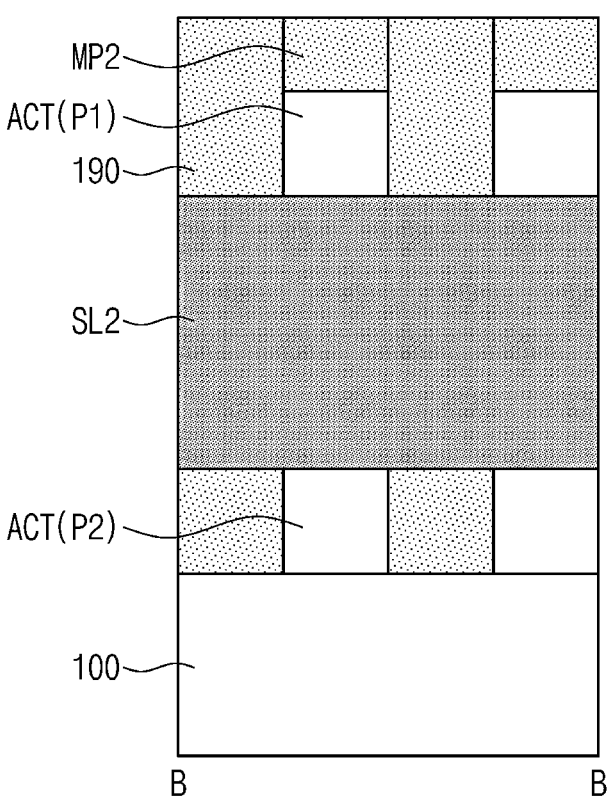

Referring to FIGS. 14 and 15, the preliminary active pattern ACTp may be divided into a plurality of active patterns ACT spaced apart from each other in the second direction D2. A third isolation pattern 190 may be formed between the active patterns ACT spaced apart from each other in the second direction D2. Each of the preliminary active patterns ACTp spaced apart from each other in the first direction D1 may be divided into the plurality of active patterns ACT, and thus the active patterns ACT may be finally spaced apart from each other in the first direction D1 and the second direction D2. In some embodiments, as shown in FIG. 15, the second sacrificial pattern SL2 may not be divided by the third isolation pattern 190 but may have a shape extending in the second direction D2. In certain embodiments, the second sacrificial pattern SL2 may be divided into a plurality of second sacrificial patterns SL2 by the third isolation pattern 190. In this case, a horizontal recess region HR may have an uneven shape by a removal process described later with reference to FIGS. 16 to 17B. Thus, the semiconductor memory device of FIG. 3 may be finally manufactured.

Figure 16:
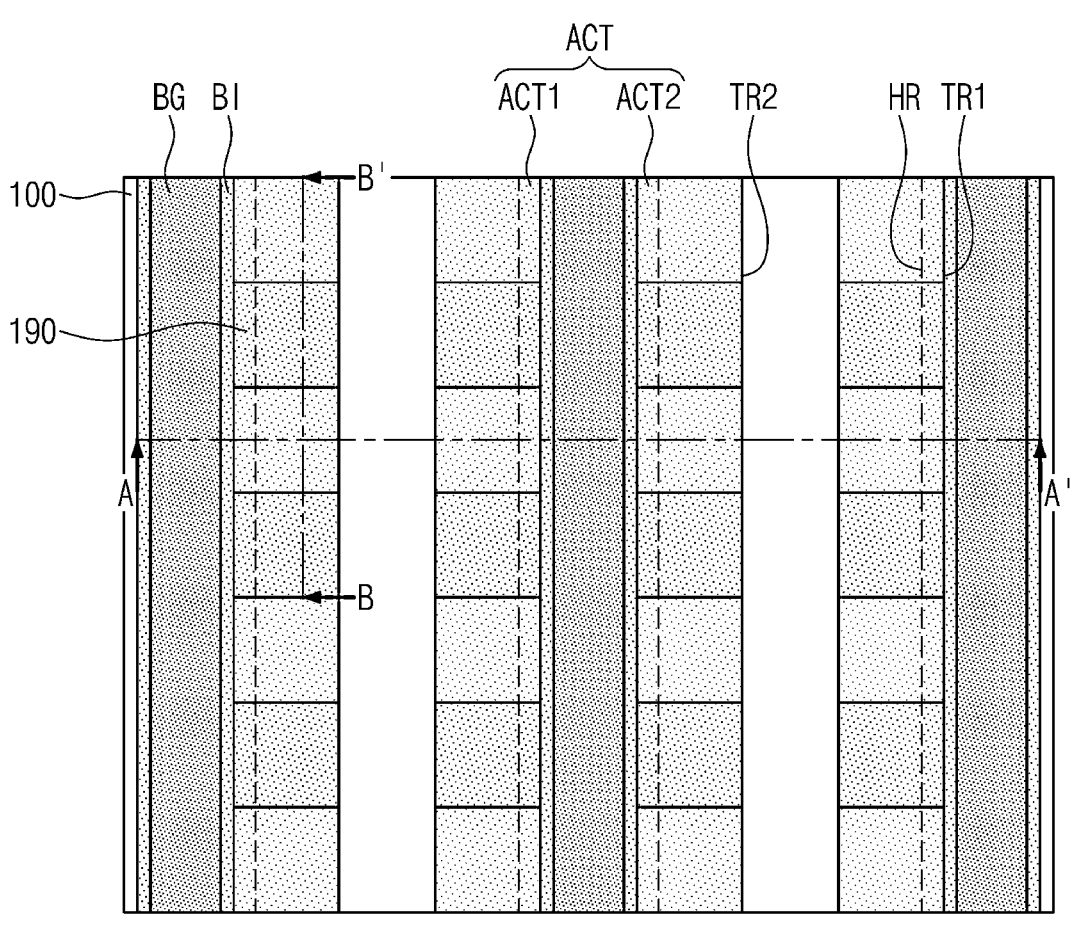
Figure 16:
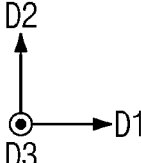
Figure 17A:
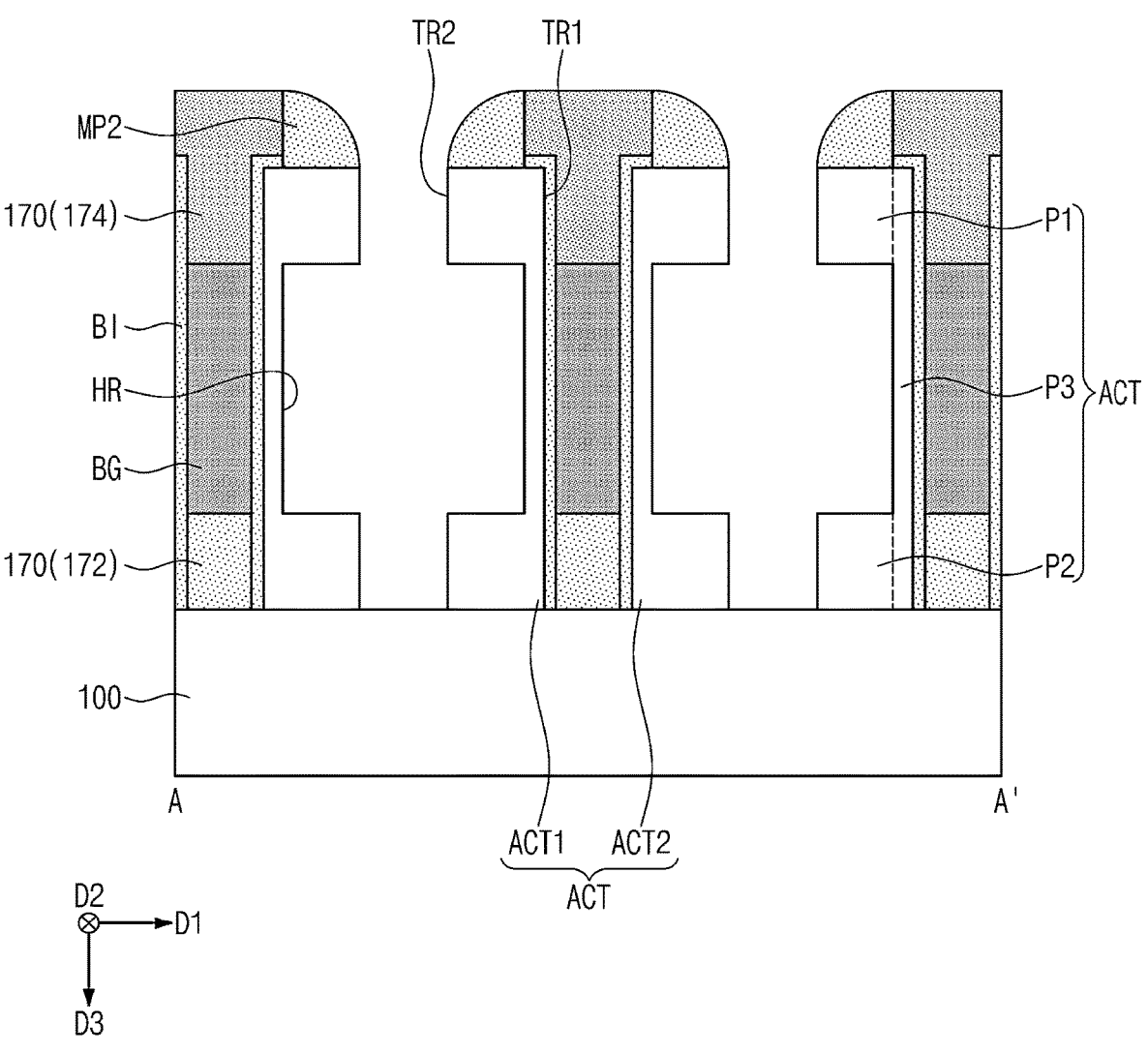
Figure 17B:
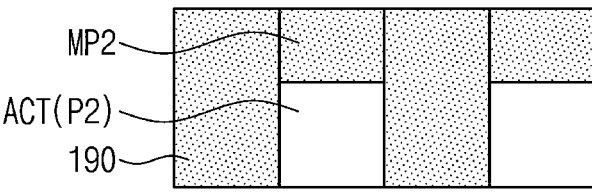
Figure 17B:
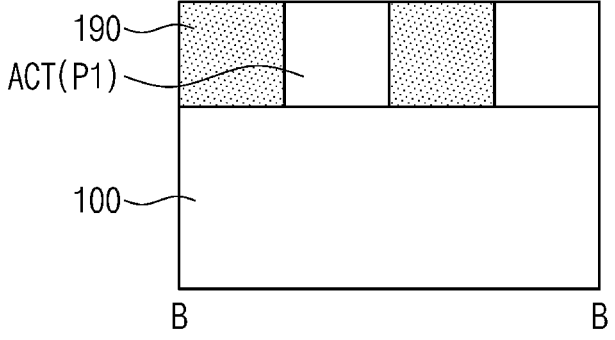
Figure 17B:
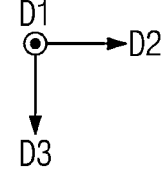

Referring to FIGS. 16 to 17B, the second sacrificial pattern SL2 may be removed. The removal of the second sacrificial pattern SL2 may include performing an isotropic etching process on the second sacrificial pattern SL2. For example, the isotropic etching process may include providing an etching material through the second trench region TR2 to remove the second sacrificial pattern SL2 exposed by the second trench region TR2. The second sacrificial pattern SL2 may have an etch selectivity with respect to the active pattern ACT. Thus, even though the second sacrificial pattern SL2 is removed, the active pattern ACT may remain. A horizontal recess region HR may be formed in a region from which the second sacrificial pattern SL2 is removed.

Figure 18:
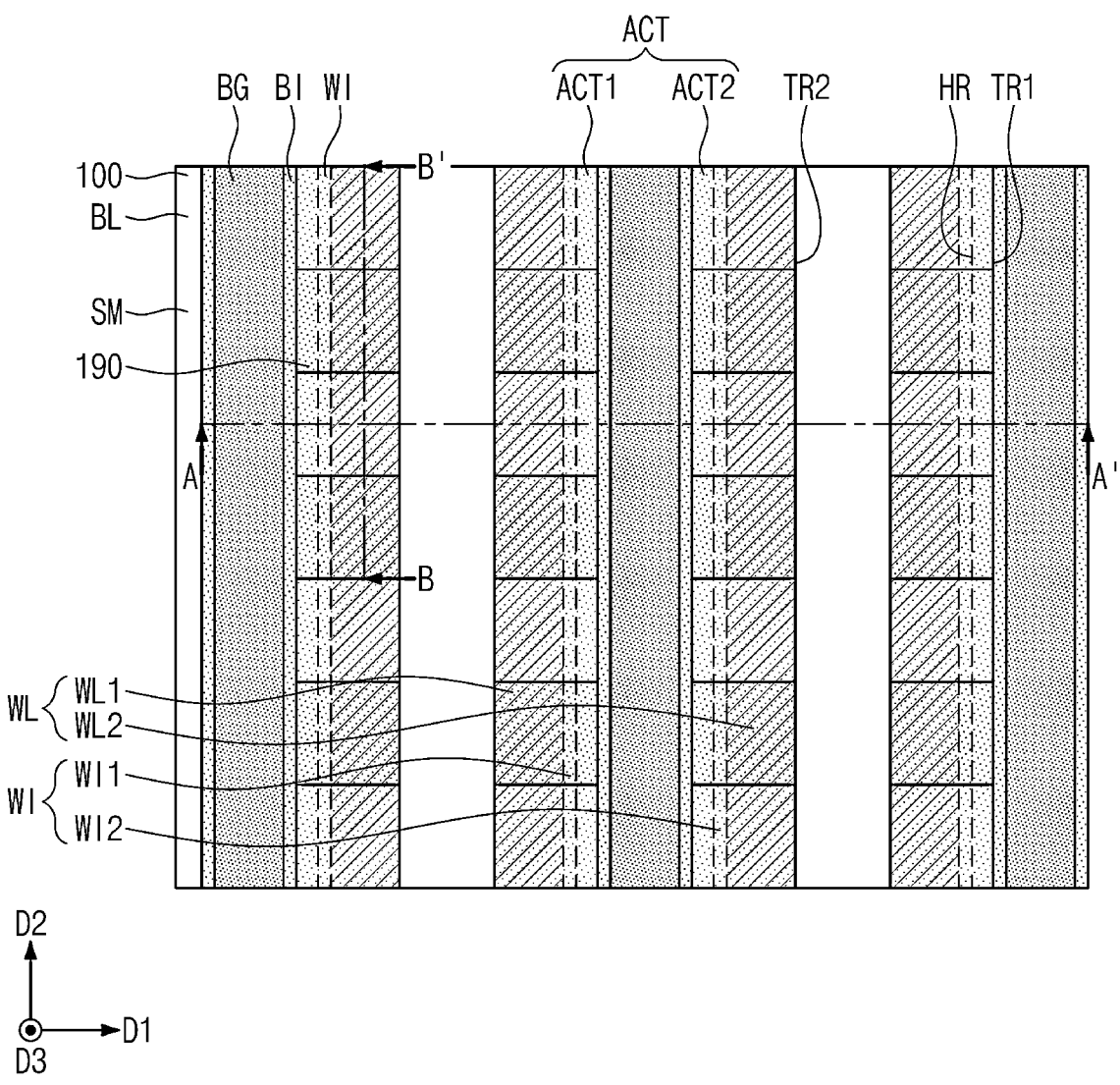
Figure 19A:
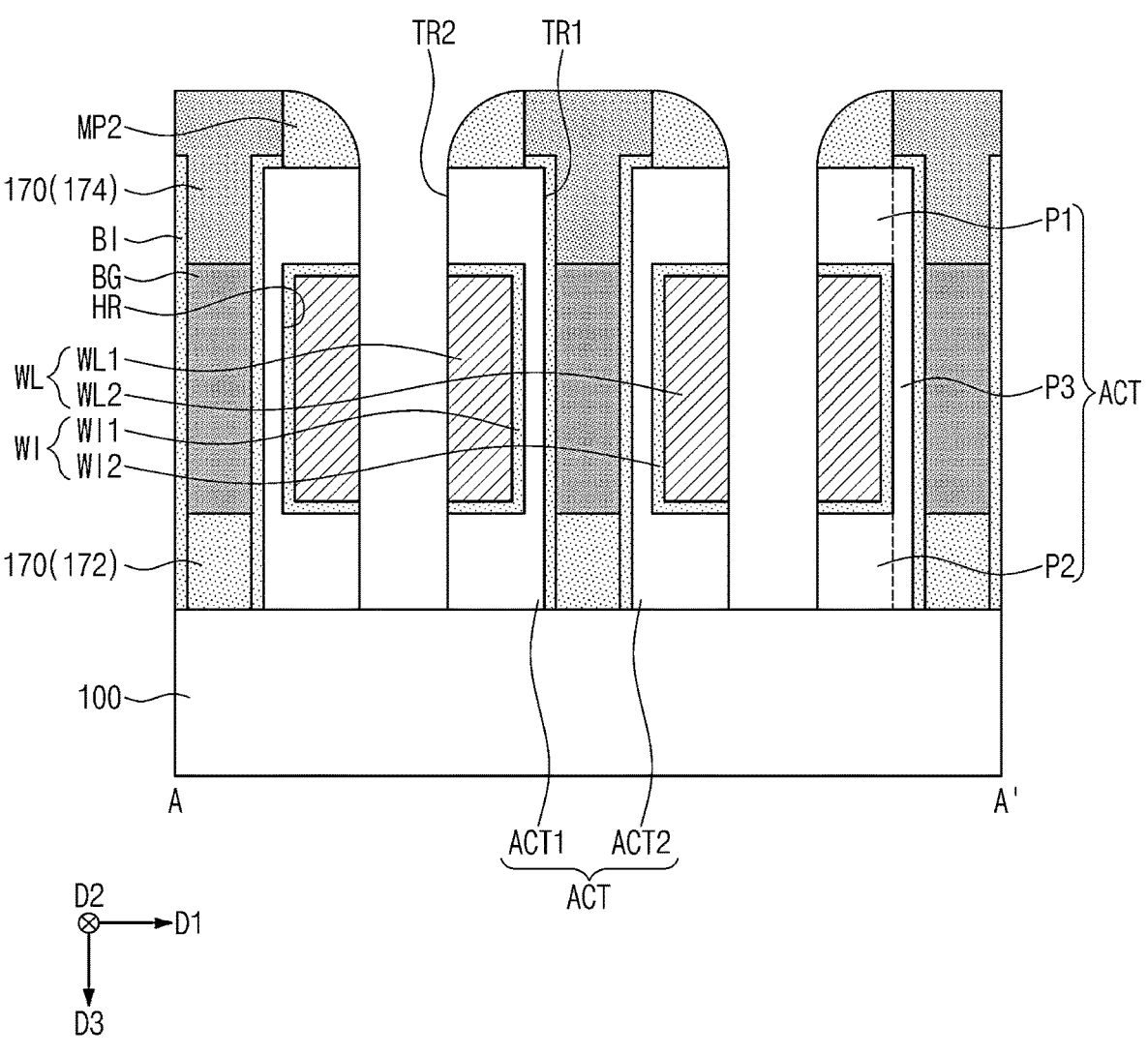
Figure 19B:
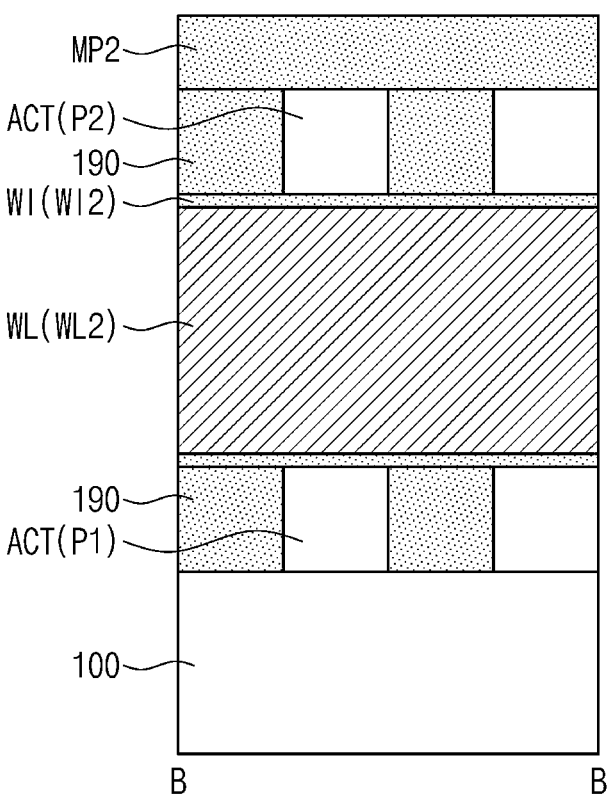
Figure 19B:
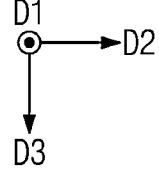

Referring to FIGS. 18 to 19B, the word line insulating pattern W1 and a word line WL may be formed in the horizontal recess region HR. The word line insulating pattern W1 may be formed to conformally cover an inner surface of the horizontal recess region HR. The word line WL may be formed to fill a remaining portion of the horizontal recess region HR.

For example, the formation of the word line insulating pattern W1 and the word line WL may include forming a word line insulating layer conformally covering an inner surface of the second trench region TR2 and the inner surface of the horizontal recess region HR, forming a word line layer filling the second trench region TR2 and the horizontal recess region HR, and removing the word line insulating layer and the word line layer in the second trench region TR2. At this time, a portion of the word line insulating layer and a portion of the word line layer, which remain in the horizontal recess region HR, may correspond to the word line insulating pattern W1 and the word line WL, respectively.

According to embodiments, a length of the word line WL in the third direction D3 may be proportional to a length of the horizontal recess region HR in the third direction D3. The length of the horizontal recess region HR in the third direction D3 may correspond to a thickness of the first sacrificial pattern SL1 (see FIG. 7A) in the third direction D3. In other words, the length of the word line WL in the third direction D3 may be easily controlled by controlling the thickness of the first sacrificial pattern SL1 in the third direction D3. As a result, a process dispersion of the lengths of the word lines WL in the third direction D3 may be reduced, and thus electrical characteristics and reliability of the semiconductor memory device may be improved.

Figure 20:
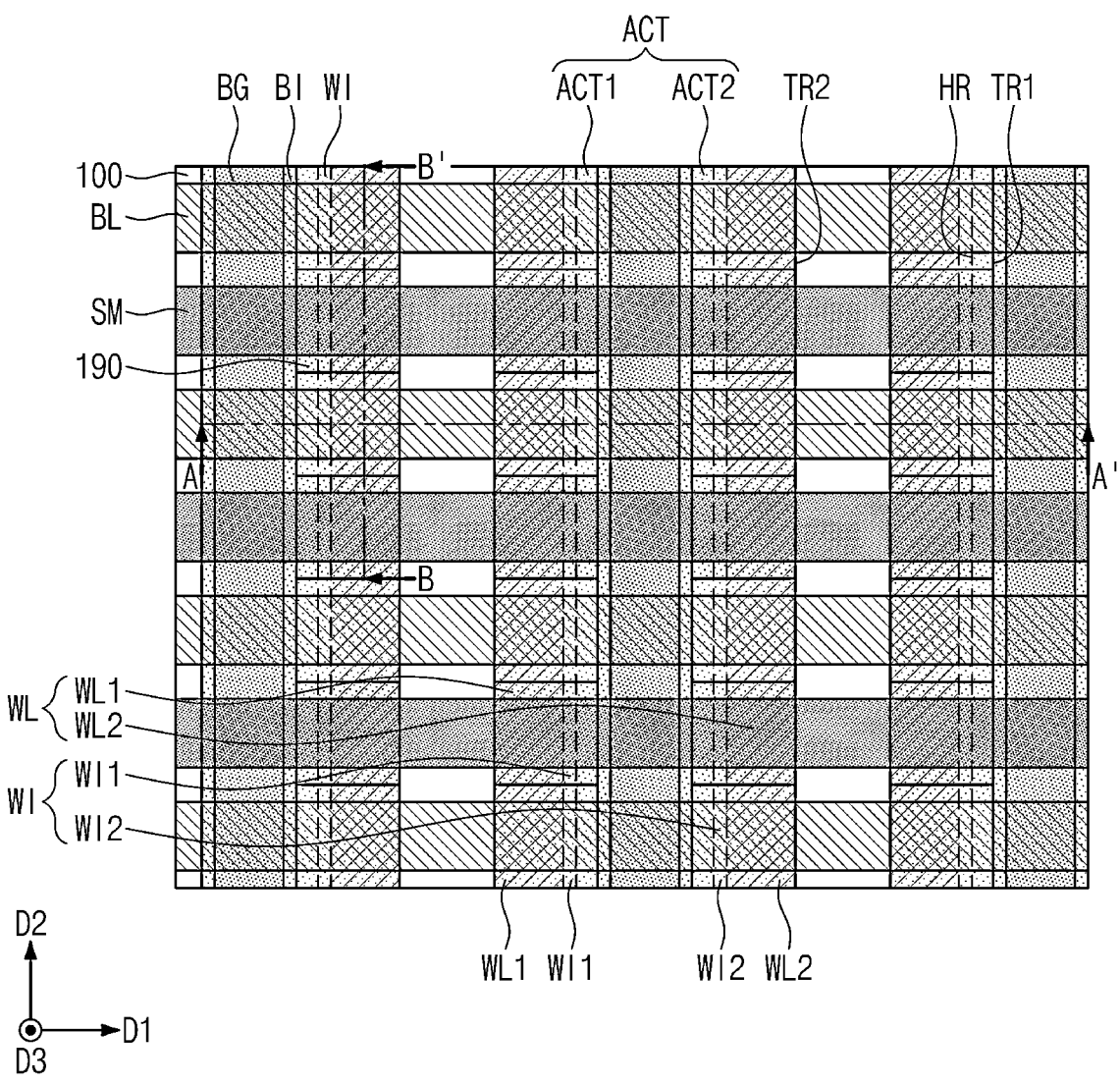
Figure 21A:
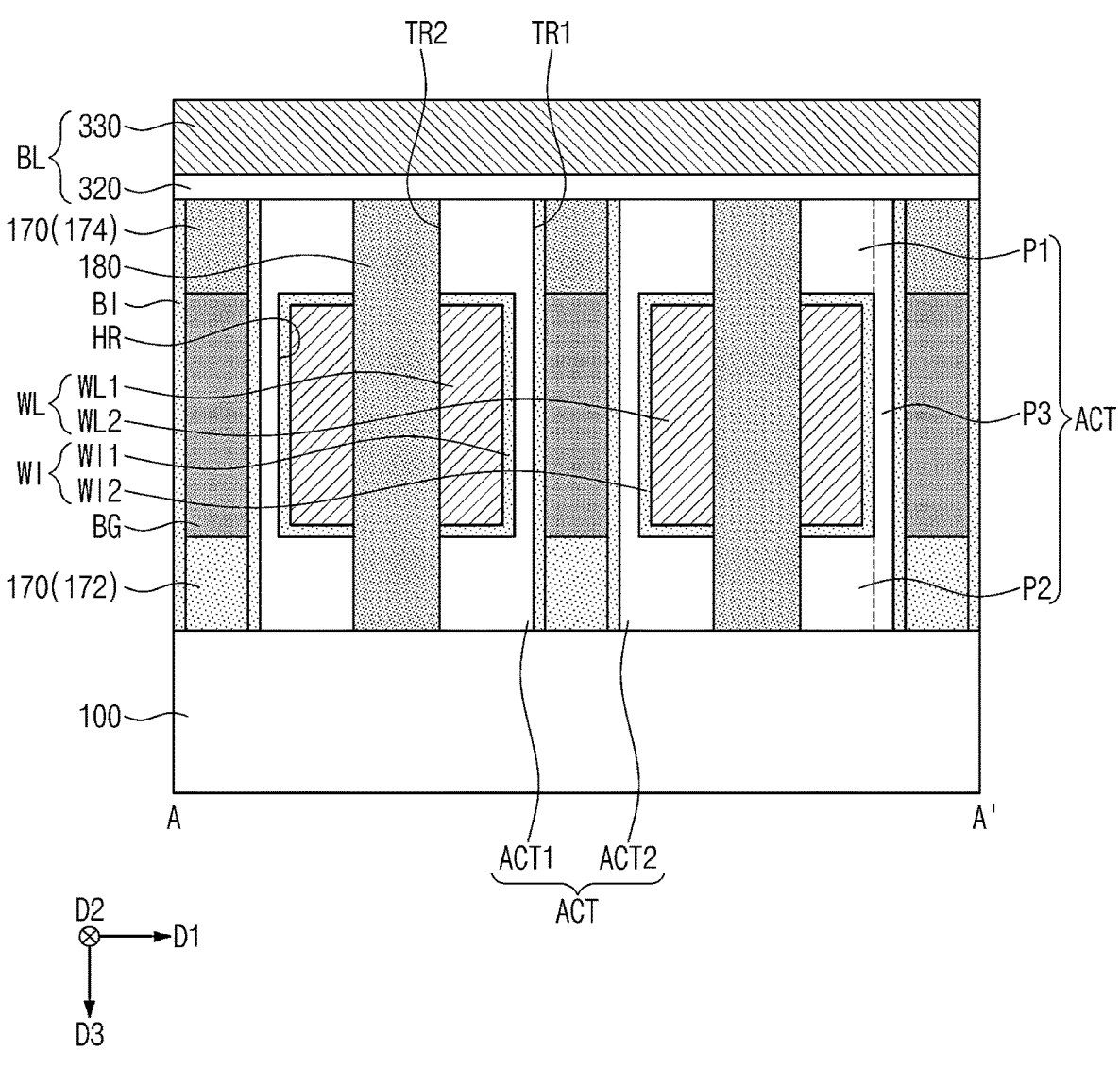
Figure 21B:
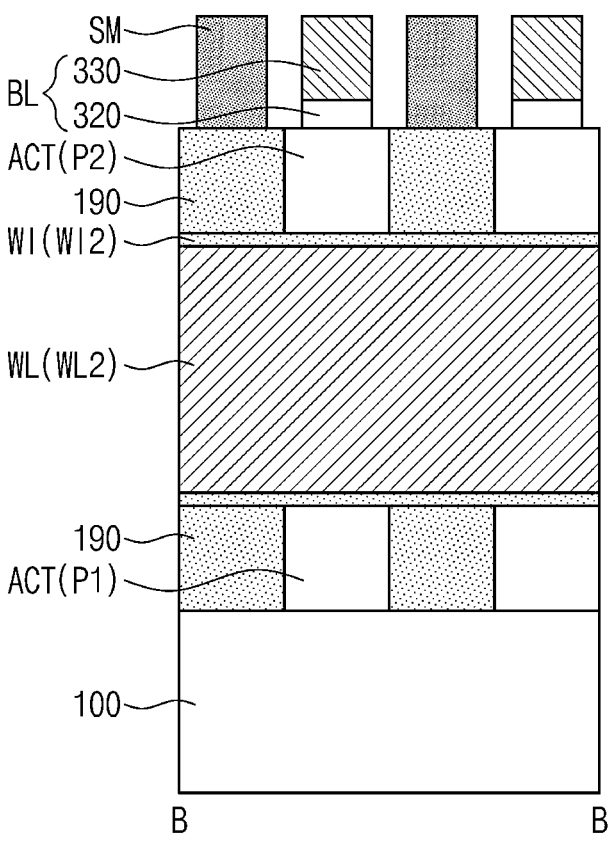
Figure 21B:
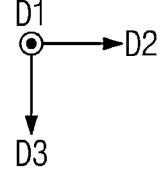

Referring to FIGS. 20 to 21B, the second isolation pattern 180 may be formed in the second trench region TR2. The second isolation pattern 180 may fill the second trench region TR2. For example, the formation of the second isolation pattern 180 may include forming an isolation layer filling the second trench region TR2 and covering a top surface of the active pattern ACT, and removing the isolation layer on the top surface of the active pattern ACT to divide the isolation layer into the second isolation patterns 180. The second mask pattern MP2 and an upper portion of the first isolation pattern 170 (i.e., an upper portion of the second sub-isolation pattern 174) may be removed before or after the formation of the second isolation pattern 180.

The bit line BL may be formed on the active pattern ACT. The formation of the bit line BL may include forming a bit line layer on an entire top surface of the base substrate 100, and etching the bit line layer to form the bit line BL. For example, the bit line layer may include a poly-silicon layer and a metal-containing layer, and remaining portions thereof after the etching process may correspond to a poly-silicon pattern 320 and a metal-containing pattern 330, respectively. A shielding structure SM may be formed between the bit lines BL adjacent to each other in the second direction D2.

Figure 22:
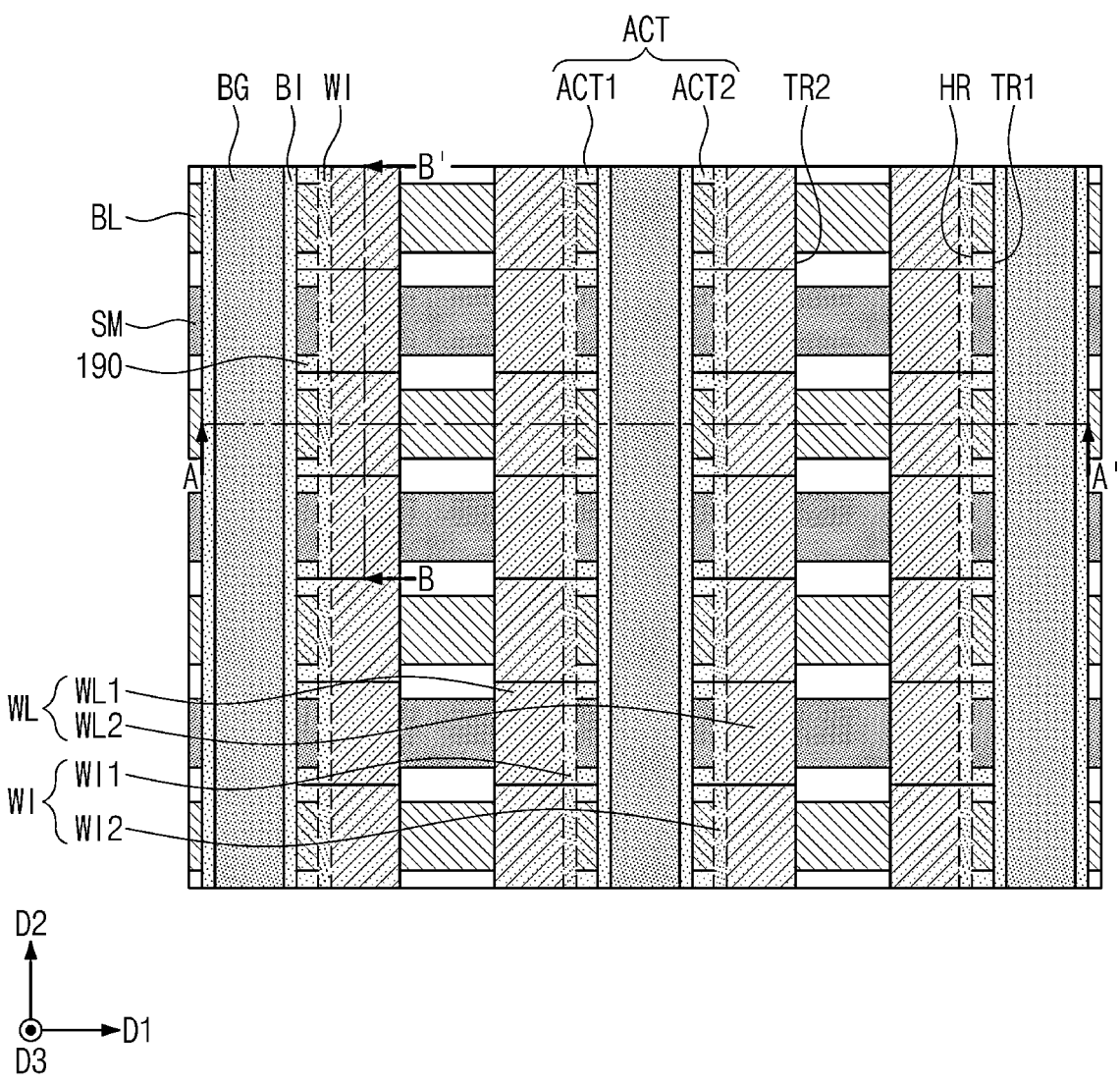
Figure 23A:
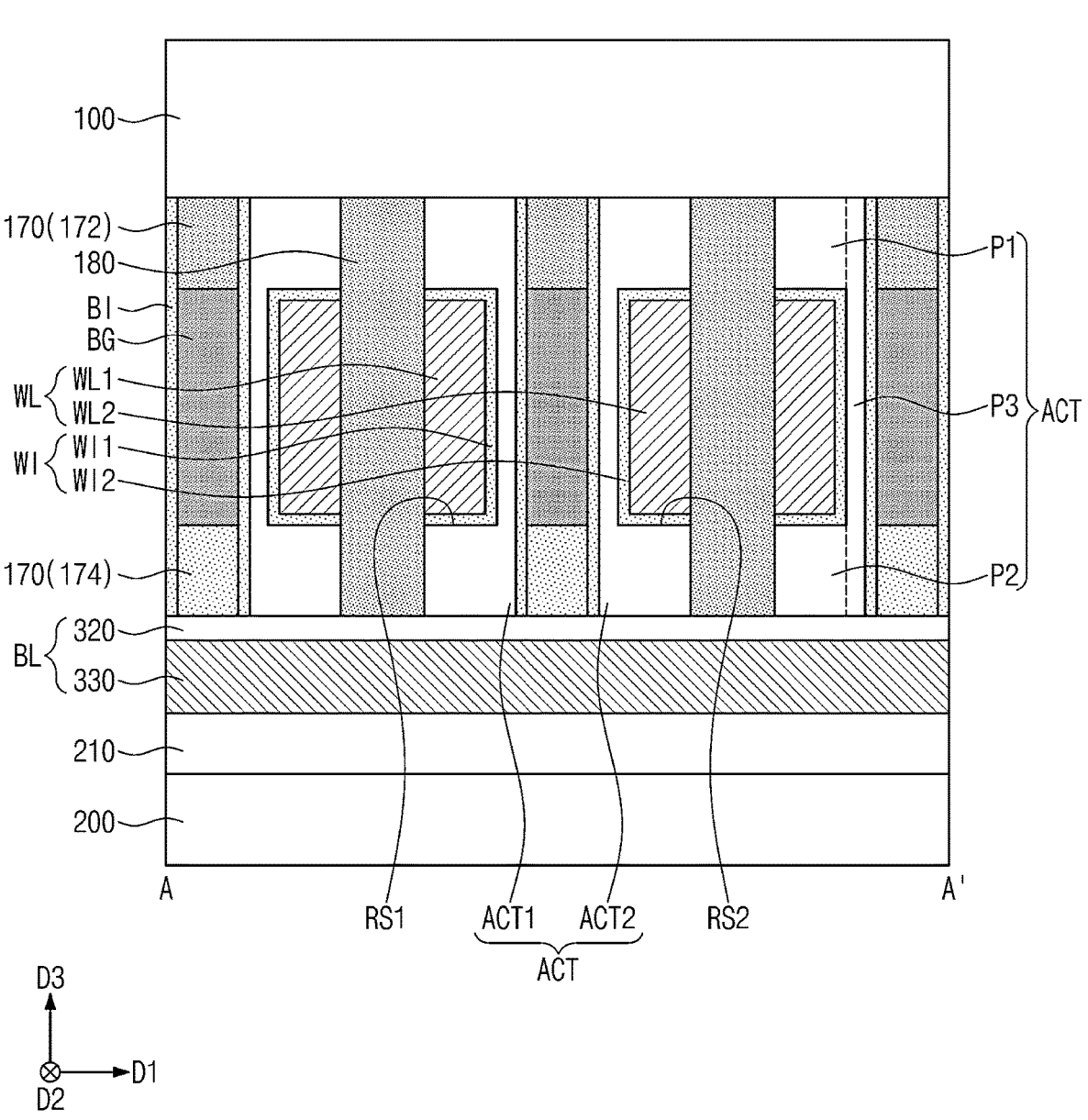
Figure 23B:
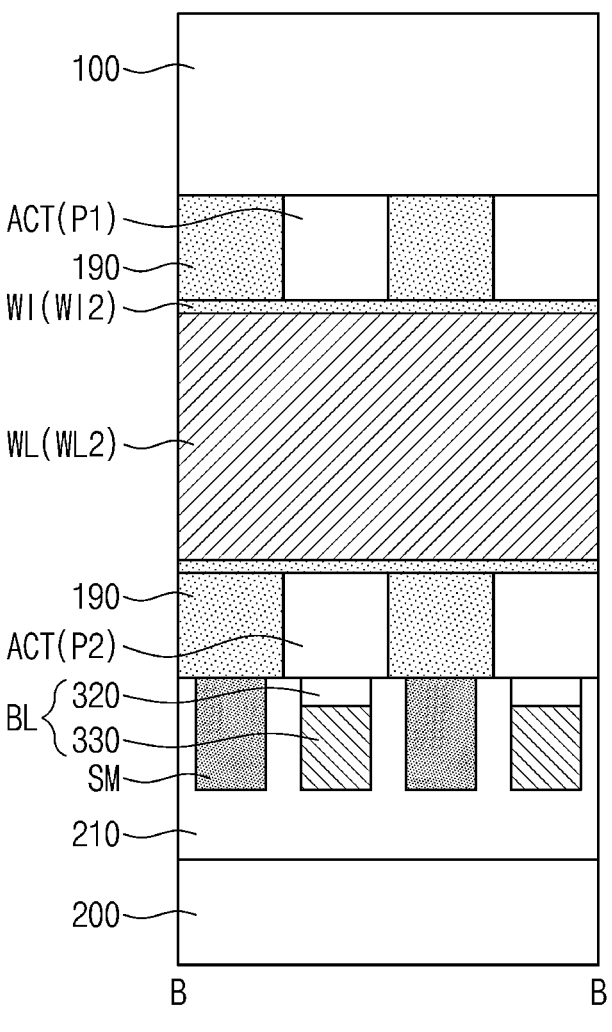
Figure 23B:
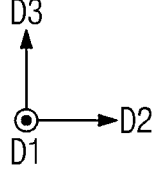

Referring to FIGS. 22 to 23B, an interlayer insulating layer 210 may be formed. The interlayer insulating layer 210 may be formed to cover the bit line BL and the shielding structure SM. Thereafter, the substrate 200 may be bonded onto the interlayer insulating layer 210. In descriptions to a manufacturing method after the bonding, terms 'top surface', 'bottom surface', etc. may respectively mean 'the top surface', 'the bottom surface', etc., described with reference to FIGS. 1 to 2B.

Referring again to FIGS. 1 to 2B, the base substrate 100 may be removed from a top surface of the active pattern ACT. The top surface of the active pattern ACT may be exposed by the removal of the base substrate 100. Thereafter, the conductive pattern CP may be formed on the top surface of the active pattern ACT.

FIGS. 24 to 27B are views illustrating a method of manufacturing a semiconductor memory device according to some embodiments. In the descriptions of FIGS. 24 to 27B, terms 'top surface', 'bottom surface', etc. may respectively mean 'the bottom surface', 'the top surface', etc. in the view of the completely manufactured semiconductor memory device described with reference to FIGS. 1 to 2B.

Figure 24:
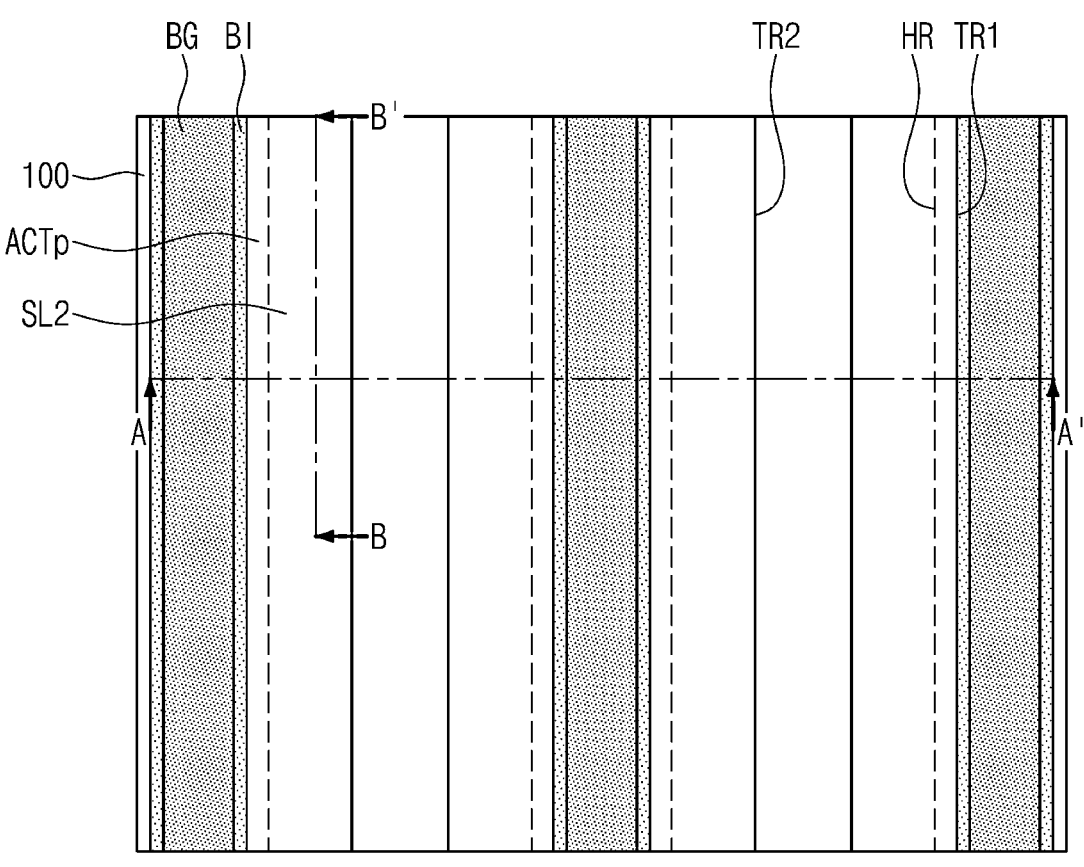
FIGS. 24 to 27B are views illustrating stages in a method of manufacturing a semiconductor memory device according to some embodiments.
Figure 24:
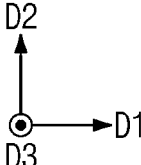
Figure 25A:
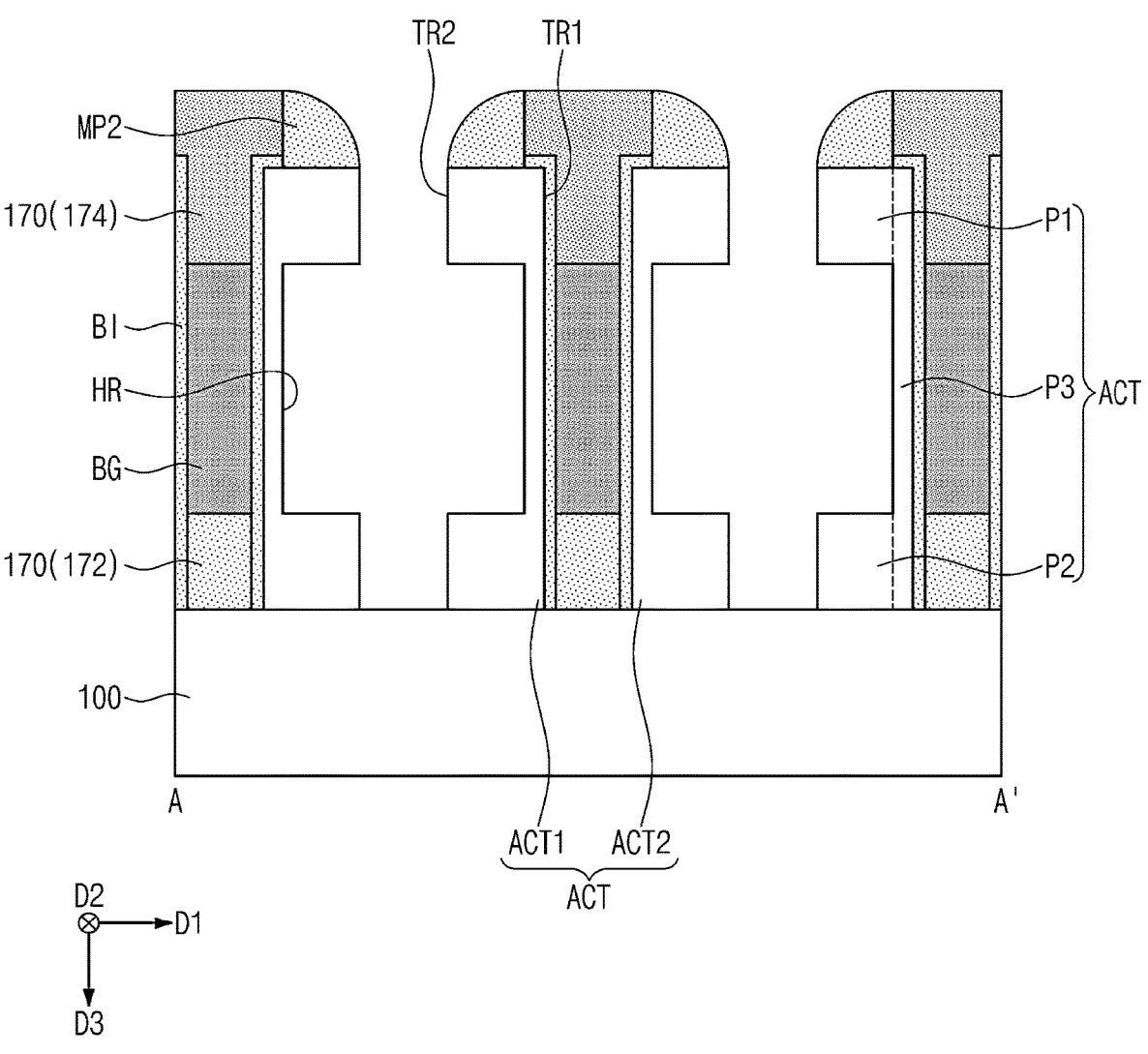
Figure 25B:
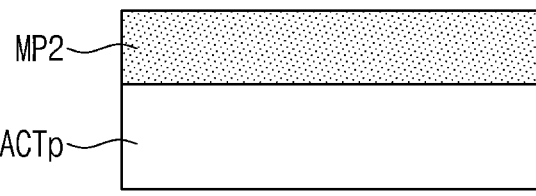
Figure 25B:
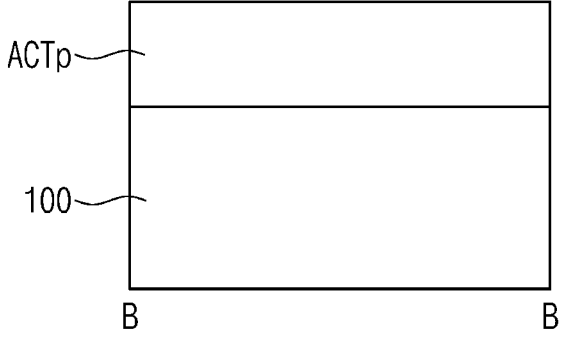
Figure 25B:
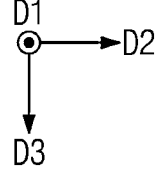

Referring to FIGS. 24 to 25B, unlike the descriptions of FIGS. 16 to 19B, the second sacrificial pattern SL2 may be removed before the formation of the third isolation pattern 190. The horizontal recess region HR may be formed in the preliminary active pattern ACTp by the removal of the second sacrificial pattern SL2. The horizontal recess region HR may extend in the second direction D2 in the preliminary active pattern ACTp.

Figure 26:
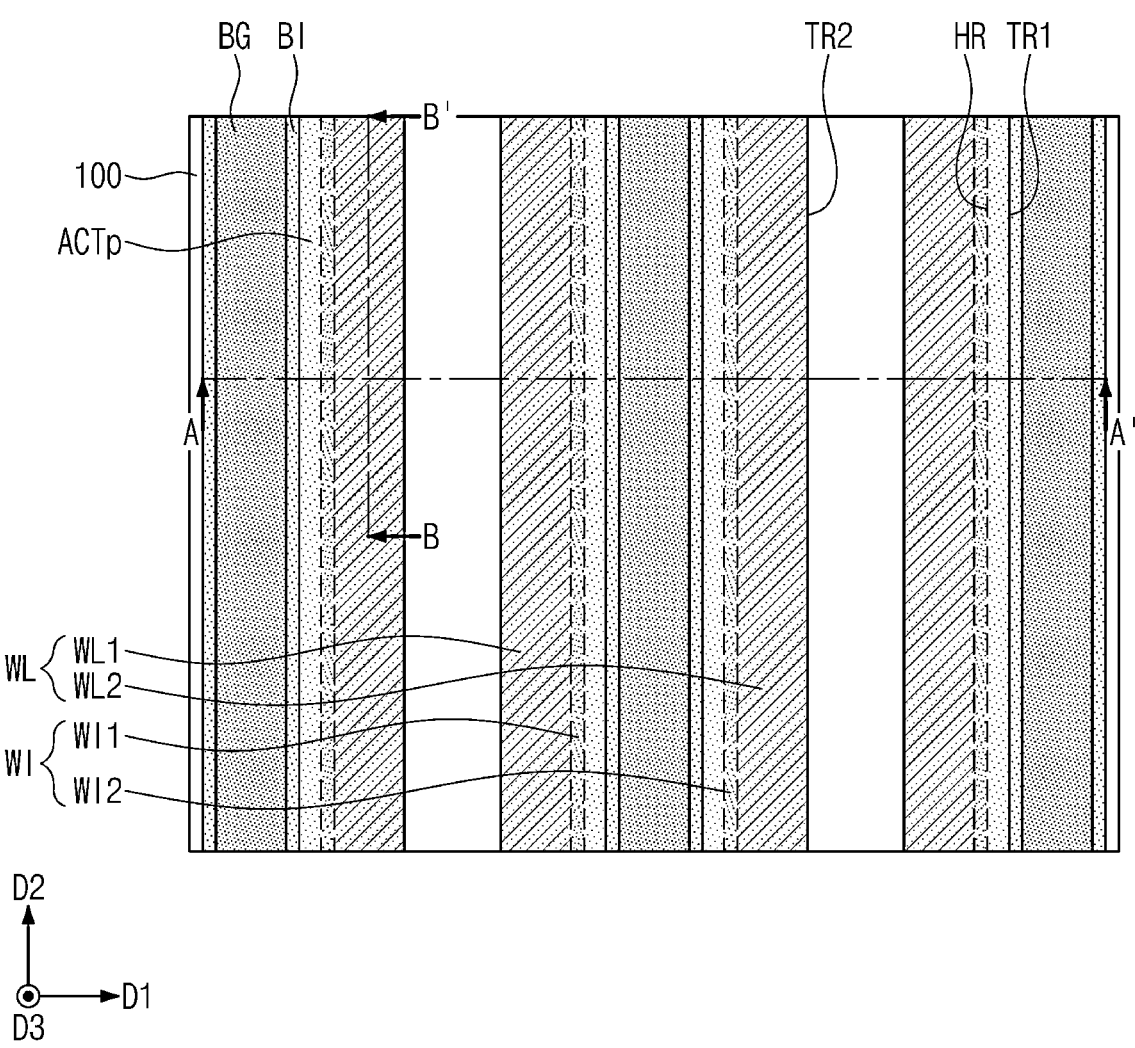
Figure 27A:
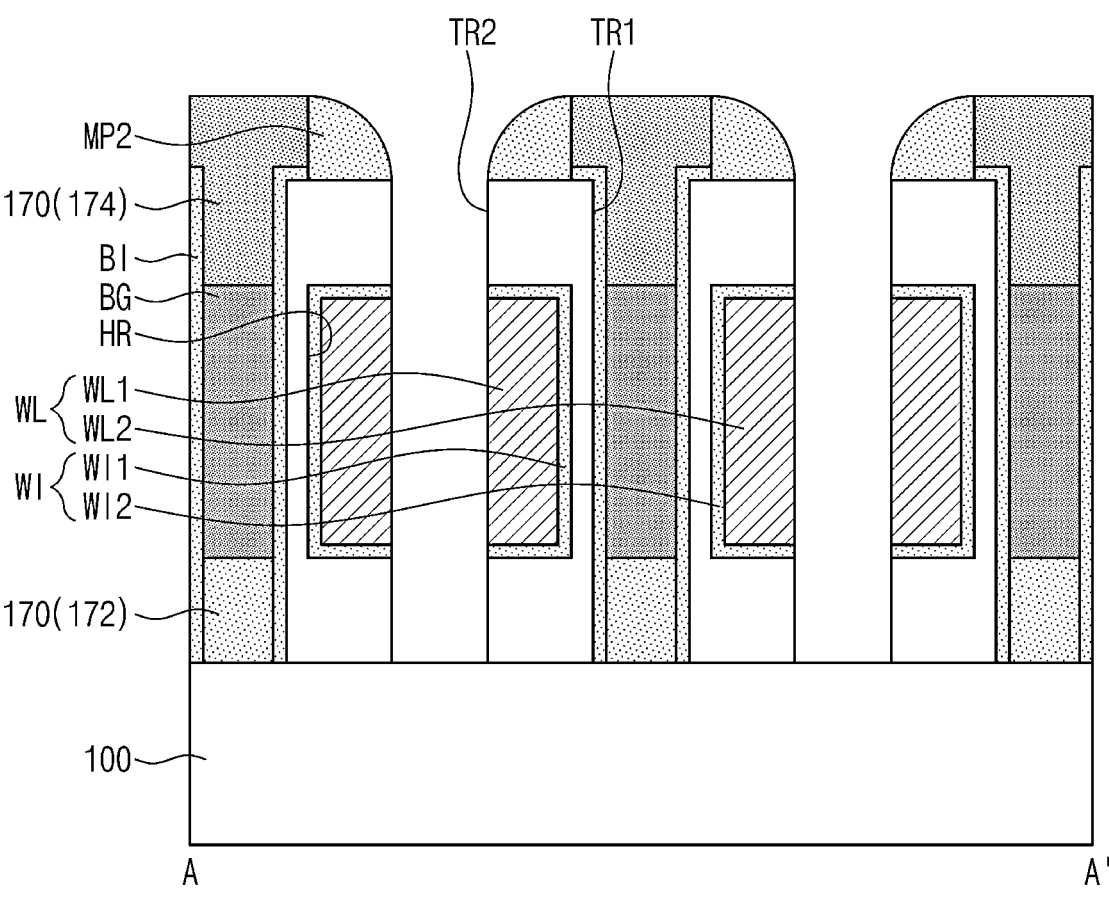
Figure 27A:
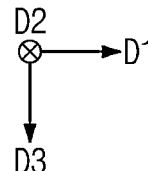
Figure 27B:
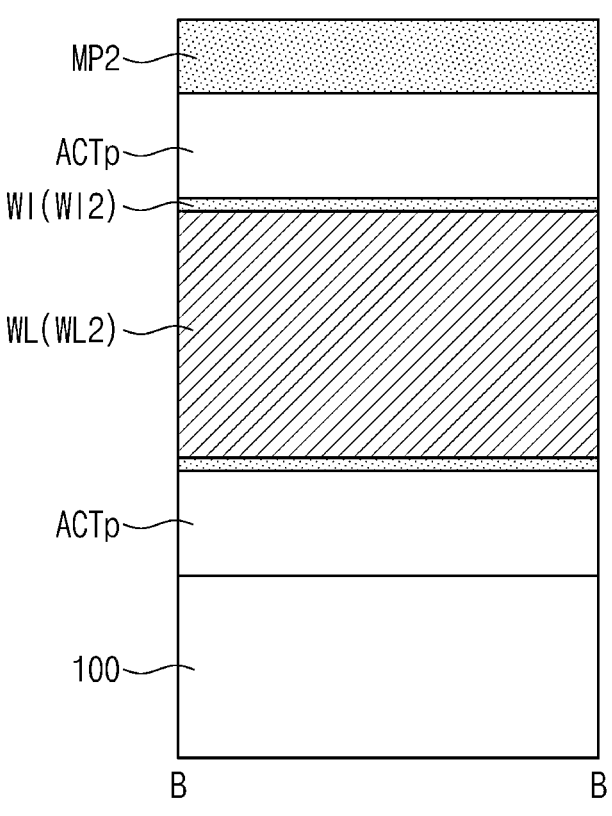

Referring to FIGS. 26 to 27B, the word line insulating pattern W1 and the word line WL may be formed in the horizontal recess region HR. The word line insulating pattern W1 and the word line WL may be formed in the preliminary active pattern ACTp.

Referring again to FIGS. 18 to 19B, the preliminary active pattern ACTp may be divided into the active patterns ACT, and the third isolation pattern 190 may be formed between the active patterns ACT. For example, the formation of the third isolation pattern 190 may include removing a portion of the preliminary active pattern ACTp, and forming the third isolation pattern 190 in a region formed by the removal of the portion of the preliminary active pattern ACTp. For example, in the removal process, the word line WL may not be removed, or a smaller amount of the word line WL than that of the preliminary active pattern ACTp may be removed. Thereafter, the semiconductor memory device may be completed using the aforementioned manufacturing method.

By way of summation and review, embodiments provide a semiconductor memory device with improved electrical characteristics, reliability and productivity, and a method of manufacturing the same.

That is, according to embodiments, the active pattern may be easily connected to the bit line and the conductive pattern, and thus the contact resistance and the process margin in the semiconductor memory device may be improved. In addition, the length of the channel region in the active pattern may be increased, and a process dispersion of the lengths of the channel regions may be reduced. As a result, the electrical characteristics, reliability and productivity of the semiconductor memory device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a substrate;
a bit line on the substrate, the bit line extending in a first direction parallel to a bottom surface of the substrate;
a first active pattern on the bit line;
a first word line intersecting the first active pattern in a second direction, the second direction being parallel to the bottom surface of the substrate and intersecting the first direction, and the first word line including a first side surface facing the first direction; and
a first conductive pattern on the first active pattern,
wherein the first active pattern includes:
a first portion between the first word line and the first conductive pattern in a vertical direction perpendicular to the bottom surface of the substrate,
a second portion between the first word line and the bit line in the vertical direction, and
a third portion extending on the first side surface of the first word line, the third portion connecting the first portion to the second portion of the first active pattern.

2. The semiconductor memory device as claimed in claim 1, wherein the first word line further includes a second side surface opposite to the first side surface, the second side surface being exposed by the first portion and the second portion of the first active pattern.

3. The semiconductor memory device as claimed in claim 1, wherein:
the first portion of the first active pattern is between a top surface of the first word line and the first conductive pattern, and the second portion of the first active pattern is between a bottom surface of the first word line and the bit line.

4. The semiconductor memory device as claimed in claim 1, further comprising a word line insulating pattern extending between the first portion of the first active pattern and the first word line, between the second portion of the first active pattern and the first word line, and between the third portion of the first active pattern and the first word line.

5. The semiconductor memory device as claimed in claim 1, further comprising a back gate electrode on the first side surface of the first word line, the third portion of the first active pattern being between the first word line and the back gate electrode.

6. The semiconductor memory device as claimed in claim 5, further comprising:

a word line insulating pattern between the first active pattern and the first word line; and a back gate insulating pattern between the first active pattern and the back gate electrode, the word line insulating pattern and the back gate insulating pattern including a same material or different materials.

7. The semiconductor memory device as claimed in claim 6, wherein each of the word line insulating pattern and the back gate insulating pattern independently includes at least one of silicon oxide, a high-k dielectric material, a low-k dielectric material, and a ferroelectric material.

8. The semiconductor memory device as claimed in claim 1, further comprising:

a second active pattern spaced apart from the first active pattern in the first direction on the bit line;

a second word line intersecting the second active pattern, the second word line including a first side surface facing the first word line; and a second conductive pattern on the second active pattern, wherein the second active pattern includes:

a first portion between the second word line and the second conductive pattern, a second portion between the second word line and the bit line, and a third portion extending on the first side surface of the second word line, the third portion connecting the first portion to the second portion of the second active pattern.

9. The semiconductor memory device as claimed in claim 8, further comprising a back gate electrode between the first active pattern and the second active pattern.

10. The semiconductor memory device as claimed in claim 8, wherein the third portion of the second active pattern is between the third portion of the first active pattern and the second word line.

11. The semiconductor memory device as claimed in claim 1, wherein:

the first active pattern has a first width in the first direction at a higher level than a top surface of the first word line, a second width in the first direction at a lower level than a bottom surface of the first word line, and a third width in the first direction at a level between the top surface and the bottom surface of the first word line, and the third width is less than each of the first width and the second width.

12. The semiconductor memory device as claimed in claim 1, wherein the third portion of the first active pattern includes a same material as the first portion and the second portion or a different material from those of the first portion and the second portion.

13. A semiconductor memory device, comprising:

a substrate;

a bit line on the substrate, the bit line extending in a first direction parallel to a bottom surface of the substrate;

a first active pattern on the bit line, the first active pattern including a first side surface and a second side surface opposite to each other in the first direction; and a first word line intersecting the first active pattern in a second direction, the second direction being parallel to the bottom surface of the substrate and intersecting the first direction, and the first word line including a first side surface and a second side surface opposite to each other in the first direction, wherein the second side surface of the first word line is aligned with the second side surface of the first active pattern, and wherein the first side surface of the first word line is between the first side surface of the first active pattern and the second side surface of the first word line.

14. The semiconductor memory device as claimed in claim 13, wherein the first side surface of the first word line is spaced apart from the first side surface of the first active pattern and the second side surface of the first active pattern.

15. The semiconductor memory device as claimed in claim 13, wherein the first active pattern covers a top surface and a bottom surface of the first word line and extends onto the first side surface of the first word line.

16. The semiconductor memory device as claimed in claim 13, further comprising a back gate electrode on the first side surface of the first active pattern, the first active pattern being between the first word line and the back gate electrode.

17. The semiconductor memory device as claimed in claim 13, further comprising:

a second active pattern spaced apart from the first active pattern in the first direction on the bit line; and a second word line intersecting the second active pattern, wherein the second active pattern includes a first side surface facing the first active pattern, and a second side surface opposite to the first side surface of the second active pattern, wherein the second word line includes a first side surface and a second side surface, which are opposite to each other in the first direction, wherein the second side surface of the second word line is aligned with the second side surface of the second active pattern, and wherein the first side surface of the second word line is between the first side surface of the second active pattern and the second side surface of the second word line.

18. The semiconductor memory device as claimed in claim 17, further comprising a back gate electrode between the first side surface of the first active pattern and the first side surface of the second active pattern.

19. A semiconductor memory device, comprising:

a substrate;

a bit line on the substrate, the bit line extending in a first direction parallel to a bottom surface of the substrate;

an active pattern on the bit line, the active pattern including a first side surface and a second side surface opposite to each other in the first direction; and a word line intersecting the active pattern in a second direction, the second direction being parallel to the bottom surface of the substrate and intersecting the first direction, and the word line being buried in the active pattern from the second side surface of the active pattern toward the first side surface of the active pattern.

20. The semiconductor memory device as claimed in claim 19, wherein the word line is between a top surface of the active pattern and a bottom surface of the active pattern.

\* \* \* \* \*